United States Patent
Hanzawa et al.

(10) Patent No.: US 7,505,296 B2
(45) Date of Patent: Mar. 17, 2009

(54) TERNARY CONTENT ADDRESSABLE MEMORY WITH BLOCK ENCODING

(75) Inventors: Satoru Hanzawa, Hachioji (JP); Takeshi Sakata, Hino (JP); Kazuhiko Kajigaya, Iruma (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/877,310

(22) Filed: Oct. 23, 2007

(65) Prior Publication Data

US 2008/0049481 A1    Feb. 28, 2008

Related U.S. Application Data

(62) Division of application No. 11/019,321, filed on Dec. 23, 2004, now Pat. No. 7,366,001.

(30) Foreign Application Priority Data

Dec. 25, 2003    (JP)    .............................. 2003-429505

(51) Int. Cl.
   *G11C 15/00*    (2006.01)
(52) U.S. Cl. .................................... 365/49.17; 365/168
(58) Field of Classification Search .............. 365/49.17, 365/49.18, 49.1, 49.12, 168; 711/108
   See application file for complete search history.

(56) References Cited

U.S. PATENT DOCUMENTS

| | | | |
|---|---|---|---|
| 4,894,799 A | 1/1990 | Hanawa et al. ................. | 365/49 |
| 6,094,368 A | 7/2000 | Ching .......................... | 365/49 |
| 6,114,873 A | 9/2000 | Sahraoui et al. ................ | 326/39 |
| 6,288,922 B1 | 9/2001 | Wong et al. .................... | 365/49 |
| 6,452,822 B1 | 9/2002 | Chai et al. ..................... | 365/49 |
| 6,539,455 B1 | 3/2003 | Khanna et al. .............. | 711/108 |
| 6,539,466 B1 | 3/2003 | Riedlinger .................. | 711/207 |

(Continued)

FOREIGN PATENT DOCUMENTS

JP    63-308796    4/1989

OTHER PUBLICATIONS

Miwa, T. et al., "A 1-Mb 2-Tr/b Nonvolatile CAM Based on Flash Memory Technologies," IEEE Journal of Solid-State Circuits, vol. 31, No. 11, Nov. 1996, pp. 1601-1609.
Lines, V. et al., "66MHz 2.3M Ternary Dynamic Content Addressable Memory," 2000 IEEE International Workshop on Memory Technology, Design and Testing, 2000, pp. 101-105.

(Continued)

*Primary Examiner*—VanThu Nguyen
*Assistant Examiner*—Alexander Sofocleous
(74) *Attorney, Agent, or Firm*—Miles & Stockbridge P.C.

(57) ABSTRACT

The range-specified IP addresses are effectively stored to reduce the number of necessary entries thereby the memory capacity of TCAM is improved. The representative means of the present invention is that: the storage information (entry) and the input information (comparison information or search key) are the common block code such that any bit must be the logical value '1'; Match-lines are hierarchically structured and memory cells are arranged at the intersecting points of a plurality of sub-match lines and a plurality of search lines; Further the sub-match lines are connected to main-match lines through the sub-match detectors, respectively and main-match detectors are arranged on the main-match lines.

5 Claims, 29 Drawing Sheets

U.S. PATENT DOCUMENTS

| | | | |
|---|---|---|---|
| 6,584,003 B1 | 6/2003 | Kim et al. | 365/49 |
| 6,717,876 B2 | 4/2004 | Vlasenko et al. | 365/207 |
| 6,906,937 B1 | 6/2005 | Nataraj | 365/49 |
| 6,910,105 B2 | 6/2005 | Ogura | 711/128 |
| 7,173,838 B2 | 2/2007 | Hanzawa | 365/49 |
| 2002/0172065 A1 | 11/2002 | Uzawa et al. | 365/49 |
| 2003/0058672 A1 | 3/2003 | Aikawa | 365/49 |
| 2004/0186972 A1 | 9/2004 | Chow et al. | 711/165 |
| 2005/0270818 A1 | 12/2005 | Hanzawa et al. | 365/49 |
| 2006/0193160 A1 | 8/2006 | Hanzawa et al. | 365/49 |

OTHER PUBLICATIONS

Ruiz-Sánchez, M. et al., "Survey and Taxonomy of IP Address Lookup Algorithms," IEEE Network, Mar./Apr. 2001, pp. 8-23.

Satoru Hanzawa et al., "A Dynamic CAM based on a One-Hot-Spot Block Code—for Millions-Entry Lookup,". 2004 Symposium on VLSI Circuits Digest of Technical Papers, pp. 382-385.

Satoru Hanzawa et al., "A Large-Scale and Low-Power CAM Architecture Featuring a One-Hot-spot Block Code for IP-Address Lookup in a Network Router," IEEE Journal of Solid-State Circuits, vol. 40, No. 4, Apr. 2005, pp. 853-861.

PRIOR ART

FIG. 19

| TERNARY NOTATION | BIT PATTERN OF SEARCH KEY | | | | BIT PATTERN OF ENTRY | | | |
|---|---|---|---|---|---|---|---|---|
| | C3 | C2 | C1 | C0 | D3 | D2 | D1 | D0 |
| 00 | 0 | 0 | 0 | 1 | 1 | 1 | 1 | 0 |
| 01 | 0 | 0 | 1 | 0 | 1 | 1 | 0 | 1 |
| 10 | 0 | 1 | 0 | 0 | 1 | 0 | 1 | 1 |
| 11 | 1 | 0 | 0 | 0 | 0 | 1 | 1 | 1 |
| X0 | - | - | - | - | 1 | 0 | 1 | 0 |
| X1 | - | - | - | - | 0 | 1 | 0 | 1 |
| 0X | - | - | - | - | 1 | 1 | 0 | 0 |
| 1X | - | - | - | - | 0 | 0 | 1 | 1 |
| XX | - | - | - | - | 0 | 0 | 0 | 0 |

FIG. 20

| Destination address prefix | Next-hop | Output interface |
|---|---|---|
| 24.40.32/20 | 192.41.177.148 | 2 |
| 130.86/16 | 192.41.177.181 | 6 |
| 208.12.16/20 | 192.41.177.241 | 4 |
| 208.12.21/24 | 192.41.177.196 | 1 |
| 167.24.103/24 | 192.31.177.3 | 4 |

PRIOR ART
FIG. 21

| DECIMAL NOTATION | BINARY NOTATION | TERNARY NOTATION (IN THE CASE OF STORING 1 TO 30) |
|---|---|---|
| 0 | 00000000 | - |
| 1 | 00000001 | 00000001 |
| 2 | 00000010 | 0000001X |
| 3 | 00000011 | |
| 4 | 00000100 | 000001XX |
| 5 | 00000101 | |
| 6 | 00000110 | |
| 7 | 00000111 | |
| 8 | 00001000 | 00001XXX |
| 9 | 00001001 | |
| 10 | 00001010 | |
| 11 | 00001011 | |
| 12 | 00001100 | |
| 13 | 00001101 | |
| 14 | 00001110 | |
| 15 | 00001111 | |
| 16 | 00010000 | 00010XXX |
| 17 | 00010001 | |
| 18 | 00010010 | |
| 19 | 00010011 | |
| 20 | 00010100 | |
| 21 | 00010101 | |
| 22 | 00010110 | |
| 23 | 00010111 | |
| 24 | 00011000 | 000110XX |
| 25 | 00011001 | |
| 26 | 00011010 | |
| 27 | 00011011 | |
| 28 | 00011100 | 0001110X |
| 29 | 00011101 | |
| 30 | 00011110 | 00011110 |
| 31 | 00011111 | - |

*FIG. 22*

| COMBINATION OF 0 TO 3 IN DECIMAL SYSTEM | TERNARY NOTATION | NOTATION OF ONE-HOT-SPOT BLOCK CODE |
|---|---|---|
| 0 | 00 | 0001 |
| 1 | 01 | 0010 |
| 2 | 10 | 0100 |
| 3 | 11 | 1000 |
| 0,1 | 0X | 0011 |
| 2,3 | 1X | 1100 |
| 0,2 | X0 | 0101 |
| 1,3 | X1 | 1010 |
| 0,3 | - | 1001 |
| 1,2 | - | 0110 |
| 0,1,2 | - | 0111 |
| 1,2,3 | - | 1110 |
| 2,3,0 | - | 1101 |
| 0,1,3 | - | 1011 |
| 0,1,2,3 | XX | 1111 |

FIG. 23

| DECIMAL NOTATION | BINARY NOTATION | ONE-HOT-SPOT BLOCK CODE (BTW3,BTW2,BTW1,BTW0) | |
|---|---|---|---|
| | | MAPPING BINARY TO ONE-HOT-SPOT BLOCK CODE | CODE PATTERN OF RANG 1 TO 30 |
| 0 | 00000000 | 0001 0001 0001 0001 | - |
| 1 | 00000001 | 0001 0001 0001 0010 | 0001 0001 0001 1110 |
| 2 | 00000010 | 0001 0001 0001 0100 | |
| 3 | 00000011 | 0001 0001 0001 1000 | |
| 4 | 00000100 | 0001 0001 0010 0001 | 0001 0001 1110 1111 |
| 5 | 00000101 | 0001 0001 0010 0010 | |
| 6 | 00000110 | 0001 0001 0010 0100 | |
| 7 | 00000111 | 0001 0001 0010 1000 | |
| 8 | 00001000 | 0001 0001 0100 0001 | |
| 9 | 00001001 | 0001 0001 0100 0010 | |
| 10 | 00001010 | 0001 0001 0100 0100 | |
| 11 | 00001011 | 0001 0001 0100 1000 | |
| 12 | 00001100 | 0001 0001 1000 0001 | |
| 13 | 00001101 | 0001 0001 1000 0010 | |
| 14 | 00001110 | 0001 0001 1000 0100 | |
| 15 | 00001111 | 0001 0001 1000 1000 | |
| 16 | 00010000 | 0001 0010 0001 0001 | 0001 0010 0111 1111 |
| 17 | 00010001 | 0001 0010 0001 0010 | |
| 18 | 00010010 | 0001 0010 0001 0100 | |
| 19 | 00010011 | 0001 0010 0001 1000 | |
| 20 | 00010100 | 0001 0010 0010 0001 | |
| 21 | 00010101 | 0001 0010 0010 0010 | |
| 22 | 00010110 | 0001 0010 0010 0100 | |
| 23 | 00010111 | 0001 0010 0010 1000 | |
| 24 | 00011000 | 0001 0010 0100 0001 | |
| 25 | 00011001 | 0001 0010 0100 0010 | |
| 26 | 00011010 | 0001 0010 0100 0100 | |
| 27 | 00011011 | 0001 0010 0100 1000 | |
| 28 | 00011100 | 0001 0010 1000 0001 | 0001 0010 1000 0111 |
| 29 | 00011101 | 0001 0010 1000 0010 | |
| 30 | 00011110 | 0001 0010 1000 0100 | |
| 31 | 00011111 | 0001 0010 1000 1000 | - |

BTWk=(Nk3,Nk2,Nk1,Nk0)=(SLk3,SLk2,SLk1,SLk0)

*FIG. 24*

| RANGE OF STORING DATA | | INPUT / OUTPUT DATA | | ONE-HOT-SPOT BLOCK CODE (BTW3,BTW2,BTW1,BTW0) | |
|---|---|---|---|---|---|
| DECIMAL NOTATION | TERNARY NOTATION | MASK | DATA | ENCODER OUTPUT / DECODER INPUT | ENTRY |
| 1 | 00000001 | 11111111 | 00000001 | 0001 0001 0001 0010 | 0001 0001 0001 1110 |
| 2 | 0000001X | 11111110 | 00000010 | 0001 0001 0001 1100 | |
| 3 | | | | | |
| 4 | 000001XX | 11111100 | 00000100 | 0001 0001 0010 1111 | 0001 0001 1110 1111 |
| 5 | | | | | |
| 6 | | | | | |
| 7 | | | | | |
| 8 | 00001XXX | 11111000 | 00001000 | 0001 0001 1100 1111 | |
| 9 | | | | | |
| 10 | | | | | |
| 11 | | | | | |
| 12 | | | | | |
| 13 | | | | | |
| 14 | | | | | |
| 15 | | | | | |
| 16 | 00010XXX | 11111000 | 00010000 | 0001 0010 0011 1111 | 0001 0010 0111 1111 |
| 17 | | | | | |
| 18 | | | | | |
| 19 | | | | | |
| 20 | | | | | |
| 21 | | | | | |
| 22 | | | | | |
| 23 | | | | | |
| 24 | 000110XX | 11111100 | 00011000 | 0001 0010 0100 1111 | |
| 25 | | | | | |
| 26 | | | | | |
| 27 | | | | | |
| 28 | 0001110X | 11111110 | 00011100 | 0001 0010 1000 0011 | 0001 0010 1000 0111 |
| 29 | | | | | |
| 30 | 00011110 | 11111111 | 00011110 | 0001 0010 1000 0100 | |

*FIG.25*

|  | VOLTAGAE OF SUB-MATCH LINE | VOLTAGE OF MAIN MATCH LINE |
|---|---|---|
| MATCHED ENTRY | ~VSS (ALL SUB-MATCH LINES ARE DISCHARGED) | >VREF (CHARGED) |
| UNMATCHED ENTRY | ~VSS OR VPC (SOME SUB-MATCH LINES ARE DISCHARGED) | ~VSS (VOLTAGE SOURCES ARE CONNECTED) |

*FIG. 26*

| DECIMAL NOTATION | BINARY NOTATION | ONE-HOT-SPOT BLOCK CODE (BTW3,BTW2,BTW1,BTW0) | |
|---|---|---|---|
| | | MAPPING BINARY TO ONE-HOT-SPOT BLOCK CODE | CODE PATTERN OF RANG 1 TO 30 |
| 0 | 00000000 | 00000001 00000001 00000001 | - |
| 1 | 00000001 | 00000001 00000001 00000010 | 00000001 00000001 11111110 |
| 2 | 00000010 | 00000001 00000001 00000100 | |
| 3 | 00000011 | 00000001 00000001 00001000 | |
| 4 | 00000100 | 00000001 00000001 00010000 | |
| 5 | 00000101 | 00000001 00000001 00100000 | |
| 6 | 00000110 | 00000001 00000001 01000000 | |
| 7 | 00000111 | 00000001 00000001 10000000 | |
| 8 | 00001000 | 00000001 00000010 00000001 | 00000001 00000110 11111111 |
| 9 | 00001001 | 00000001 00000010 00000010 | |
| 10 | 00001010 | 00000001 00000010 00000100 | |
| 11 | 00001011 | 00000001 00000010 00001000 | |
| 12 | 00001100 | 00000001 00000010 00010000 | |
| 13 | 00001101 | 00000001 00000010 00100000 | |
| 14 | 00001110 | 00000001 00000010 01000000 | |
| 15 | 00001111 | 00000001 00000010 10000000 | |
| 16 | 00010000 | 00000001 00000100 00000001 | |
| 17 | 00010001 | 00000001 00000100 00000010 | |
| 18 | 00010010 | 00000001 00000100 00000100 | |
| 19 | 00010011 | 00000001 00000100 00001000 | |
| 20 | 00010100 | 00000001 00000100 00010000 | |
| 21 | 00010101 | 00000001 00000100 00100000 | |
| 22 | 00010110 | 00000001 00000100 01000000 | |
| 23 | 00010111 | 00000001 00000100 10000000 | |
| 24 | 00011000 | 00000001 00001000 00000001 | 00000001 00001000 01111111 |
| 25 | 00011001 | 00000001 00001000 00000010 | |
| 26 | 00011010 | 00000001 00001000 00000100 | |
| 27 | 00011011 | 00000001 00001000 00001000 | |
| 28 | 00011100 | 00000001 00001000 00010000 | |
| 29 | 00011101 | 00000001 00001000 00100000 | |
| 30 | 00011110 | 00000001 00001000 01000000 | |
| 31 | 00011111 | 00000001 00001000 10000000 | - |

$BTDk=(Nk7,Nk6,...,Nk0)=(SLk7,SLk6,...,SLk0)$

*FIG. 27*

| COMBINATION OF 0 TO 3 IN DECIMAL SYSTEM | TERNARY NOTATION | LOGIC VALUE OF SEARCH KEY (SL00,SL01,...,SL03) | LOGIC VALUE OF BLOCK MASK SIGNAL BMSK0 |
|---|---|---|---|
| 0 | 00 | 0001 | 0 |
| 1 | 01 | 0010 | 0 |
| 2 | 10 | 0100 | 0 |
| 3 | 11 | 1000 | 0 |
| 0,1 | 0X | 0011 | 0 |
| 2,3 | 1X | 1100 | 0 |
| 0,2 | X0 | 0101 | 0 |
| 1,3 | X1 | 1010 | 0 |
| 0,3 | - | 1001 | 0 |
| 1,2 | - | 0110 | 0 |
| 0,1,2 | - | 0111 | 0 |
| 1,2,3 | - | 1110 | 0 |
| 2,3,0 | - | 1101 | 0 |
| 0,1,3 | - | 1011 | 0 |
| 0,1,2,3 | XX | 0000 | 1 |

FIG. 28

| COMBINATION OF 0 TO 3 IN DECIMAL SYSTEM | TERNARY NOTATION | LOGIC VALUE OF SEARCH KEY (SL00,SL01,...,SL03) | LOGIC VALUE OF BLOCK MASK SIGNAL BMSK0 |
|---|---|---|---|
| 0 | 00 | 0001 | 1 |
| 1 | 01 | 0010 | 1 |
| 2 | 10 | 0100 | 1 |
| 3 | 11 | 1000 | 1 |
| 0,1 | 0X | 0011 | 1 |
| 2,3 | 1X | 1100 | 1 |
| 0,2 | X0 | 0101 | 1 |
| 1,3 | X1 | 1010 | 1 |
| 0,3 | - | 1001 | 1 |
| 1,2 | - | 0110 | 1 |
| 0,1,2 | - | 0111 | 1 |
| 1,2,3 | - | 1110 | 1 |
| 2,3,0 | - | 1101 | 1 |
| 0,1,3 | - | 1011 | 1 |
| 0,1,2,3 | XX | 0000 | 0 |

TERNARY CONTENT ADDRESSABLE MEMORY WITH BLOCK ENCODING

CROSS-REFERENCE TO RELATED APPLICATIONS

This application is a division of application Ser. No. 11/019,321 filed Dec. 23, 2004 now U.S. Pat No. 7,366,001.

TECHNICAL FIELD OF THE INVENTION

The present invention relates to a semiconductor device, especially, a semiconductor device includes a content addressable memory cell (CAM cell) to compare the information stored in storage nodes with the input information. The array of CAM stores or compares the information encoded in the semiconductor device.

BACKGROUND OF THE INVENTION

Based on that Internet has been become explosively widespread, table scale for routers and switches in a network is significantly enlarged so that it should address to speed up table search. A ternary content addressable memory (TCAM) is paid attention as means of solving the problem in terms of the hardware.

FIG. 2 is a schematic view of a router configuration. The figure is an example of a router comprised of a network interface NIF, a network processor NP, a search engine SE, a lookup table LUT and a content memory CM. The network interface NIF and the network processor NP are connected though a system bus SBS. The network processor NP and the search engine SE are connected through an inner bus IBS. The search engine SE and the lookup table LUT are connected through a data bus DQ. Where the lookup table LUT is a TCAM, the content memory CM is a static random access memory (SRAM) or a dynamic random access memory (DRAM). The router transmits/receives packets from Internet network IPN through the network interface NIF. The network processor NP decodes and reconfigures the content of the packet received. For example, a destination Internet protocol address (IP address) read from the header of the packet is transferred to the lookup table LUT through the search engine SE. The lookup table LUT stores a plurality of destination IP addresses and generates an address to read from information regarding the destination IP address from the content memory CM if the inputted destination IP address is stored therein. The content memory CM stores such as path information and port numbers required to transfer packets and outputs information corresponding to the address which is inputted through a content memory address bus CADD to the network processor NP though the content bus CBS and the search engine SE. The network processor NP reconfigures the content of the header based on the information and transfers the packet from the designated port to the next relay point.

Non-patent document 1: IEEE, Journal of Solid-state circuits, vol. 31, No. 11, November 1996, p1601-1609 describes a TCAM cell configuration in the TCAM. FIG. 3 shows a cell configuration of FIG. 1 of the non-patent document 1. The cell is comprised of the following three circuit blocks: a first block is a memory cell SMC31 comprised of NMOS transistor N311, N312, N313 and N314, and PMOS transistor P311 and 312 as well as so called SRAM cell; a second circuit block is a memory cell SMC 32 comprised of NMOS transistor N321, N322, N323 and N324, and PMOS transistor P321 and P322 as well as the memory cell SMC31; a third circuit block is a comparator MUC comprised of NMOS transistor N331, N332, N333, N334 and N335. The memory cell SMC31 stores binary information '0' or '1' and the memory cell SMC32 stores a third information 'X' so called "Don't care" state, respectively. These information can be written and read as known SRAMs by selectively activating a word line WL31 or WL32. The comparator MUC performs XNOR-operation to compare storage information and input information.

A search operation in the case where the storage information is '1' is described for example. In this case, it is assumed that a storage node NT is driven to a source voltage VDD and a storage node NB is driven to a ground voltage VSS in the memory cell SMC311. Now if it is assumed that the TCAM cell is not "Don't care" state and a storage node DC in the memory cell SMC32 is driven to the source voltage VDD, the transistor N331 and N335 in the comparator MUC are conductive, respectively, and the transistor N332 is cut off. In this state, if a match line ML is precharged to the voltage higher than the ground voltage VSS and then the information '1' is inputted, a bit line BLB among a bit line BLT and the bit line BLB with the ground voltage VSS is driven to the source voltage VDD so that the transistor N334 in the comparator MUC is conductive. However since the transistor N332 is cut off, the relation between the match line ML and the ground electrode is kept to be opened. Accordingly, the voltage of the match line ML kept at the precharge voltage is discriminated by a match line sense amplifier (not shown in the figure) so that it is determined that the compared information are matched. Alternatively, if the information '0' is inputted, the bit line BLT among the bit line BLT and the BLB with the ground voltage VSS is driven to the source voltage VDD so that the transistor N333 in the comparator MUC is conductive. Accordingly, the match line ML and the ground electrode are short-circuited through the transistor N335, N331 and N333 so that the match line ML is discharged. That is to say, the match line sense amplifier discriminates that the voltage of the match line ML is decreased so that the compared information are not matched. If the TCAM cell in the figure is "Don't care" state, since the storage node DC in the memory cell SMC 32 is driven to the ground voltage VSS, the transistor N335 in the comparator MUC is cut off. Therefore, since even if any information is inputted, a current path between the match line ML and the ground electrode is not formed, the match line ML is kept at the precharge voltage so that it is forcibly determined that the compared information are matched. Additionally, in case of the third information 'x' that the input information indicates so-called "masking", both of the bit line BLT and BLB are kept at the ground voltage VSS so that the transistor N333 and N334 in the comparator MUC are cut off. Therefore, even if the memory cell SMC31 stores any information, a current path is not also formed between the match line ML and the ground electrode so that the match line ML is kept the precharge voltage thereby it is forcibly determined that the compared information are matched.

Non-patent document 2: Records of the 2000 IEEE International Workshop on Memory Technology, Design and Testing, 2000, p101-105 describes another TCAM cell configuration. FIG. 4 is the cell configuration of FIG. 2 of the non-patent document 2. The cell includes a storage node N1 and N2 comprised of NMOS transistor T1, T2, T4 and T6, and capacitor C1 and C2 and stores ternary information. The cell has XNOR calculation function by transistor T3, T4, T5, and T6 and compares the storage information and the input information.

Firstly, the memory function is described. The ternary information consists of information '1', information '0' and information 'x' indicating "Don't care" state. If high voltage is logic '1' and low voltage is logic '0', the logic value of the storage nodes (N1, N2) are in the case of the information '1' is (1, 0), in the case of the information '0' is (0, 1) and in the case of the information 'X' is (0, 0). The refresh of the storage information is performed through the transistor T1 and T2. A read and rewrite is performed using sense amplifiers connected to the bit line BL1 and BL2, respectively (not shown in the figure).

Next, the XNOR calculation function is described. The information to be compared with the storage information is inputted through the search line SL1 and SL2 and is ternary information. The ternary information consists of information '1', information '0' and information 'X' indicating masking. If both information are matched in the comparison operation, a current path is not formed between the match line precharged to the high voltage and a discharge line DCL fixed to the low voltage (for example ground voltage VSS) so that the match line is kept the precharge voltage. Alternatively, if the information are not matched, a current path is formed between the match line ML and the discharge line DCL so that the match line ML is discharged. The voltage variation of the match line ML by the above described operation is discriminated by the match line sense amplifiers (not shown in the figure) to determine the result of comparison. Incidentally, if the storage information and the input information are 'X', a current path is not formed between the match line ML and the discharge line DCL so that it is determined that the compared information are matched.

Patent document 1: U.S. Pat. No. 6,288,922 describes further another TCAM cell configuration. FIG. 5 of the present application is the cell configuration shown in FIG. 4 of the patent document 1. The cell TMC is comprised of four memory cells HMC0-HMC3 arranged at the intersecting points of the match line ML and comparison data line C0-C3, respectively. Each memory cell is comprised of a NMOS transistor T51 and T52, and a memory circuit SC. A node to which the memory circuit SC and the gate electrode of the transistor T51 are connected is referred to as a storage node. Storage nodes D0-D3 are clearly shown in order to discriminate per memory cell in the figure. Since such cell TMC corresponds to double TCAM cells of FIG. 4, it is referred to as twin TCAM cell.

FIG. 19 is a data pattern of the twin TCAM for the ternary value. The data pattern of the comparison information is defined such that any one of comparison data lines C0-C3 is driven to the logical value '1' for 00-11 (binary value), respectively. Meanwhile the memory circuit SC of each memory cell MC0-MC3 stores the value that the polarity of the logical value defined by the comparison data lines C0-C3 is inverted. The data pattern on storing the ternary value is the value obtained by the AND-operation regarding the storage information of the corresponding binary value per bit. For example, the data pattern corresponding to the ternary information 'XO' is a pattern '1010' as the result of the AND operation per bit regarding the storage information '1110' corresponding to the binary value '00' and the storage information '1011' corresponding to the binary value '10'. Such definition of the logical value causes the number of the comparison data line to be driven to decrease so that the power consumption for the search operation can be reduced.

SUMMARY OF THE INVENTION

The present inventors studied to achieve the TCAM array having the large capacity prior to the prevent invention. Especially, when the present inventors paid attention to the number of words used for storing the range-specified IP address, the inventors noticed that the TCAM needs a plurality of words for storing a plurality of IP addresses so that the memory capacity comes short. In the TCAM, "Entry" is usually used as the term corresponding to "word" generally used for DRAM and SRAM. "Entry" also indicates information stored in each word so that hereinafter "Entry" is used in accordance with the customary practice.

Non-patent document 3: IEEE Network, March/April, 2001, p 8-23 describes the routing table used for the search algorithm of IP address. In Internet protocol version 4 (Ipv4), IP address is described by binary number with 32 bits. The IP address described by the binary number with 32 bits is divided by 8 bits so that it may be described with four sets of decimal number. For example, IP address 130.86.16.66 in decimal number notation is described as 10000010_01010110_00010000_01000010 in binary number notation. The high-order bits (a plurality of digits on the left side) indicate the network placed at the high level of the Internet network which forms a hierarchical structure, and the low-order bits (the digits on the right side) indicate a host placed at the low level. Where, a specific bit notation is described that high-order bits which indicates the network is described in binary number notation and the subsequent low-order bits is described with asterisks *, respectively. Such bit notation is referred to as address prefix. For example, address prefix 1000001001010110* indicates $2^{16}$ of addresses in which the high-order bit starts at 1000001001010110. Additionally prefix 1000001001010110* may be described as 130.86/16 in decimal number notation. Where the number followed by the slash '/' indicates the prefix length.

FIG. 20 is the routing table of Table 1 of the non-patent document 3. Packets are sent to the destination through a plurality of routers set on the network. Accordingly, each router may only store not each address of the host but the network address common to a plurality of hosts. That is to say, the routing table may only stores destination address prefix as FIG. 20. According to FIG. 20, for example, the packet having the destination IP address 130.86.16.66 is transferred from the sixth output interface to the next-hop as the next relay 192.41.177.181.

The conventional network is classified into three class according to the scale. That is to say, the class A is a network with the prefix length 8 and holds the IP addresses assigned to $2^{24}$ of hosts. The class B is a network with the prefix length 16 and holds the IP addresses assigned to $2^{16}$ of hosts. The class C is a network with the prefix length 24 and holds the IP addresses assigned to $2^{8}$ of hosts. However, along with the widespread of Internet in recent years, a new technique referred to as classless interdomain routing (CIDR) that any prefix length is applicable has been introduced in replacement of the above described classification method in order to efficiently assign IP addresses to the subdivided hosts.

In CIDR environment, IP address in various ranges should be stored in the routing table. For example, a method of storing a plurality of IP addresses is described with reference to FIG. 21 based on the assumption that the host assigned with the IP address as 130.86.16.1-130.86.16.30 forms a group. Where, the 1-30 on the right edge among the IP addresses described with four decimal numbers are considered for ease of explanation. The data pattern of the eight lower-order bits among the total 32 bits described in binary number notation is considered therewith. The 1-30 (decimal number) is described by eight patterns by grouping the corresponding binary value in units of power of 2 using the information 'X' indicating "Don't care" state when it is described with the ternary value. It means that if the IP address 130.86.16.1 to 130.86.16.30 of the host is stored in the routing table using the TCAM, it should be expanded to eight entries to store. As thus described above, the TCAM comes short of the memory capacity when the IP address minutely specified the range.

IT is caused that the TCAM cell of FIG. 2 and FIG. 3 stores only ternary information nevertheless it is capable of storing the quaternary value information in principle. The cause can be specifically understood by considering that the information can be stored in two TACM cells. FIG. 22 is a table showing fifteen combinations of 0-3 (decimal number). If any number is extracted from four samples, there are sixteen combinations ($=2^4$). However, the combination that any number is not selected (i.e. any of 0-3 is not stored) is omitted in FIG. 22. If the combinations of those numbers are described with the ternary value, only nine combinations ($=3^2$) can only described. Accordingly, if the range 1-3 (decimal number) is stored using the two TCAM cells to store ternary information for example, it should be expanded two entries of 1 (ternary notation: '01') and 2-3 (ternary notation: '1X') to store them. Thus when the range-specified IP address is stored, the memory usage is increased.

The above described problem is further turned worse when the TCAM is used for search operation in the router other than the routing. For example, if the propriety of the packet sending is controlled based on the destination IP address and the origin IP address as the Packet classification described in Non-patent document 4: IEEE Network, March/April, 2001, p 24-32, both IP addresses should be stored in the entry. If both addresses are specified for the ranges, each range is pluralized by ternary notation thereby the number of entries are increased according to the combinations of the ternary values. Specifically, in the case of the destination IP address is 130.86.16.1-130.86.16.30 and the origin IP address is 230.86.16.1-230.86.16.30, since each specified range is expressed by eight sort of ternary values, the number of the combinations becomes sixty-four so that sixty-four entries are required.

Since the twin TCAM cell TMC is comprised of four memory cells to store binary information, it can store all of fifteen combinations of 0-3 (decimal number) by one entry. However, since the comparison information can not take the combination of plural numbers as FIG. 19, the search operation using a third information 'X' equivalent to the masking as described in FIG. 2 and FIG. 3 can not performed.

As thus described above, the object of the present invention is that the range-specified IP address is efficiently stored to solve to run short of the memory capacity of TCAM. That is to say, the object of the present invention is that a method of storing IP address and a TCAM array configuration to achieve a large capacity TCAM is provided.

The representative means of the present invention is as follows. Storage information (entry) and input information (comparison information or search key) are the common block code such that any bit must be the logical value '1'. Match lines are hierarchically constructed and memory cells arranged at the intersecting points of a plurality of sub-match lines and a plurality of search lines. The sub-match lines are connected to the main-match lines through the sub-match detectors, respectively. The comparison results of information are determined for each sub-match line. A small signal generated in the main-match lines is determined by main-match detectors according to the comparison results to determine the comparison results of all of the entries.

BRIEF DESCRIPTIONS OF THE DRAWINGS

FIG. 19 is an explanatory view of the logical value of the comparison information and the storage information used for the twin ternary content addressable memory cell of FIG. 5;

FIG. 20 is an explanatory view of the routing table;

FIG. 21 is an explanatory view of the correspondence between the binary notation and the ternary notation;

FIG. 22 is an explanatory view of an example of data pattern of the One-hot-spot block code used for the memory array of FIG. 1 according to the embodiment 1;

FIG. 23 is an explanatory view of another example of data pattern of the One-hot-spot block code used for the memory array of FIG. 1 according to the embodiment 1;

FIG. 24 is an explanatory view of further another example of data pattern of the One-hot-spot block code used for the memory array of FIG. 1 according to the embodiment 1;

FIG. 25 is an explanatory view of the voltage relation of the match lines corresponding to the search result in the memory array of FIG. 1 according to the embodiment 1;

FIG. 26 is an explanatory view of an example of data pattern of the One-hot-spot block code used for the memory array of FIG. 12 according to the embodiment 2;

FIG. 27 is an explanatory view of an example of data pattern of the One-hot-spot block code and the block mask signal used for the memory array of FIG. 13 according to the embodiment 3;

FIG. 28 is an explanatory view of another example of data pattern of the One-hot-spot block code and the block mask signal used for the memory array of FIG. 17 according to the modification added to embodiment 3;

DESCRIPTION OF THE PREFERRED EMBODIMENTS

Figure 1:
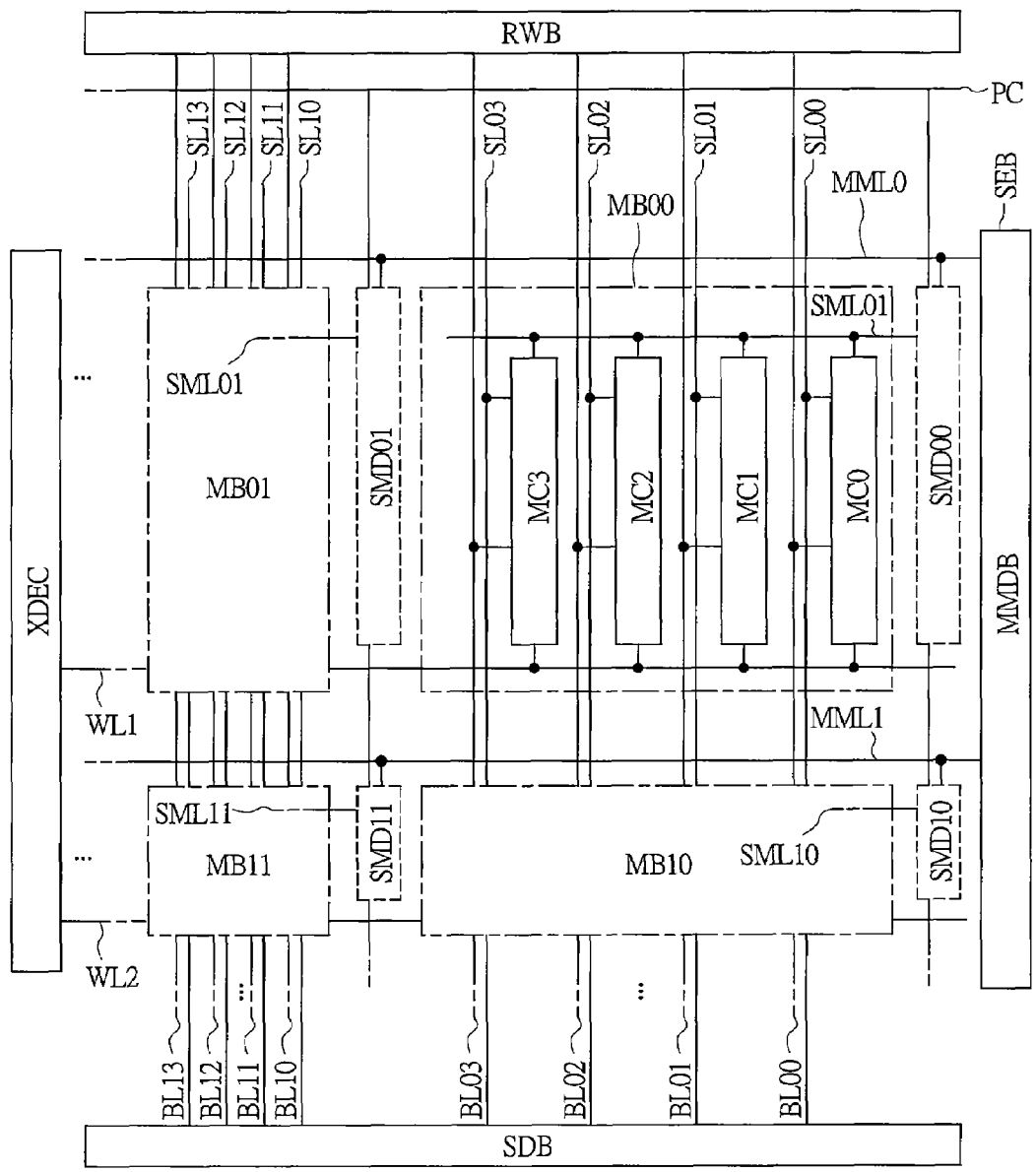
FIG. 1 is an explanatory view of a constitutional example of the memory array using the hierarchical match line structure in the ternary content addressable memory according to the embodiment 1.

The range-specified IP address can be efficiently stored while the search operation of the entry and the search key using the third information 'X' is enabled as well as the conventional TCAM. Therefore, the memory array capacity can be effectively increased.

Hereinafter the embodiment of the present invention is described with reference to the drawings. The circuit elements constituting each block of the embodiment are not particularly limited. However typically, the circuit elements are formed on a semiconductor substrate such as a single crystal silicon by the well-known semiconductor integrated circuit technology such as a CMOS (Complementary MOS transistor).

EXAMPLE 1

<One-hot-spot Block Code>

FIG. 22 is a table described an example of the data pattern of codes according to the present invention corresponding to the conventional ternary notation. The code of the present embodiment has three features as will hereinafter be described in detail. The first feature is that the positional difference of the logical value '1' corresponds 0-3 (decimal number). The second feature is that the data pattern is common between the entry and the search key. The third feature is that the CAM to perform the search operation using the codes of the present embodiment encodes the plural bits of data inputted (where, it is IP address) in units of 2 bits as FIG. 22 as well as the conventional TCAM. Hereinafter such code using the present invention is referred to as "One-hot-spot block" code.

Firstly, the codes corresponding 0-3 (decimal number) set to sequentially '0001', '0010', '0100' and '1000', where the logical value '1' is shift from the lowest bit (the digit at right most) to the immediate left position one by one. The codes corresponding to a combination of a plurality of numbers is obtained by the OR-operation regarding the code corresponding to each number per bit. For example, the code corresponding to the combination of 0 and 1 (decimal number) is '0011' as the result of performing the OR-operation for the code '0001' and '0010'. The same OR-operation is repeated so that the codes corresponding to all combinations are obtained as FIG. 22. According to such principle of encoding, a code for much more information is described hereinafter.

FIG. 23 is a table expressing each code corresponding to 0-31 (decimal number). An example that 8 bits of binary value is encoded in units of 2 bits as well as FIG. 22 is expresses in the figure. The obtained codes have a data pattern consisting of 16 bits in which a code of 4 bits per 1 block (=$2^2$) is repeated for 4 blocks (8[bit]/2[bit/block]). Where, four code blocks expressed as BTW3, BTW2, BTW1 and BTW0 in descending order from the left. Additionally, regarding the after-described entry and search key as the components of the code blocks BTWi (i=0, 1, 2 and 3), the entry is expressed as (Ni3, Ni2, Ni1 and Ni0) in descending order from the left and the search key also is expressed as (SLi3, SLi2, SLi1 and SLi0) Hereinafter a blank is inserted between each block in order to clearly exhibit to encode in units of 2 bits.

Firstly, One-hot-spot block code for 0-3 (decimal number) is defined. The data pattern of the code block BTW0 is that the logical value '1' is shifted from N00 (or SL00) to N03 (or SL03) one bit by one bit as described in FIG. 22. All of the data pattern of the code blocks BTW1-BTW3 are '0001'.

Next, the data pattern for 4-7 (decimal number) is such that the logical value '1' in the code block BTW0 is shifted from N00 (or SL00) to N03 (or SL03) again one bit by one bit while the logical value '1' in the code block BTW1 is shifted to the left (from N10 (or SL10) to N11 (or SL11) by 1 bit. As described above, subsequently the block code for 8-15 (decimal number) is defined such that the shift of the logical value '1' in the code block BTW0 is repeated while the logical value '1' is shifted to the left by 1 bit every time the decimal number increases by four.

If the data patterns of the adjacent low-order code blocks (where, block BTW0 and BTW1) reach '1000' together, the logical value '1' in the immediate upper code block (where, block BTW2) is shifted to the left (where, from N30 (or SL30) to N31 (or SL31) by 1 bit. In this state, the data pattern of the code block BTW0 and BTW1 are assigned as well as 0-15 (decimal number) so that the block codes for 16-31 (decimal number) are defined.

Next, the data pattern to describe plural numbers is described below taken the range 1-30 (decimal number) as an example. Firstly, the block BTW0 is brought together for the range of 1-3 (decimal number) and expressed code '0001 0001 0001 1110' as well as FIG. 22. Next, the block code for the range 4-15 (decimal number) is expressed '0001 0001 1110 1111' by performing the OR-operation for each bit of the corresponding block code. Just the same, the range of 16-27 (decimal number) is expressed as '0001, 0010, 0111, 1111'. At the last, the range of 28-30 (decimal number) is expressed as '0001, 0010, 1000, 0111', thereby the range of 1-30 (decimal number) is expressed by four block codes. This number is half of the conventional ternary notation (eight)

described in FIG. 21. Therefore, the number of entries required for storing the range-specified entry is reduced thereby to store effectively.

Figure 5:
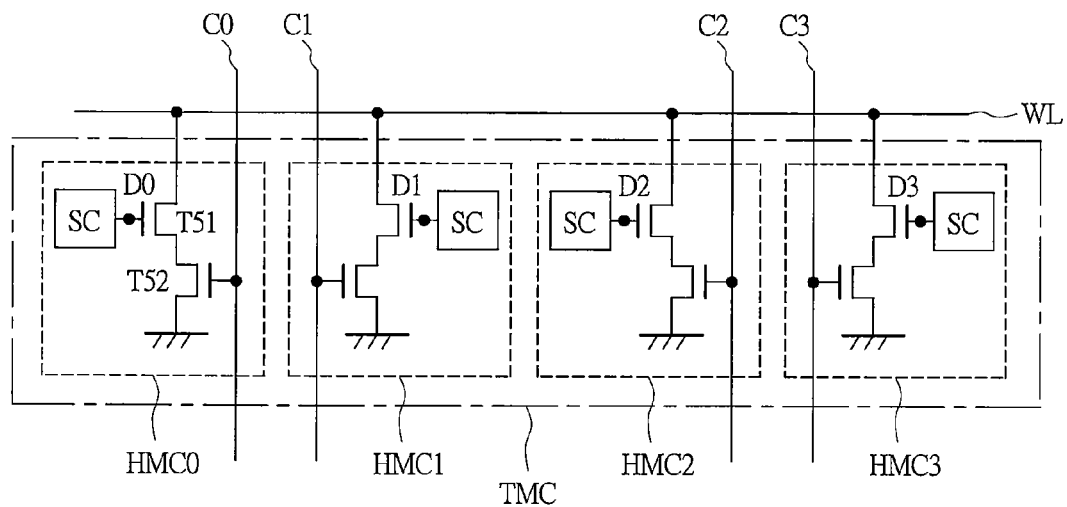
FIG. 5 is an explanatory view of the configuration of the conventional twin ternary content addressable memory cell formed of two ternary content addressable memory cells.

Regarding the code according to the present invention, only one logical value '1' is included in the data pattern of each code block of the search key encoded corresponding to the binary value so that charge/discharge power of the search lines on the search operation can be decreased as well as the twin TCAM cell TMC of FIG. 5. So far the code with the data pattern that the logical value '1' is shifted to the left by 1 bit every time the decimal number is increased by 1 has been described. However, the data pattern is limited to be described above and other patterns may be applied. For example, the data pattern such that the logical value '1' in the code block BTW0 for 0-3 (decimal number) is shifted to the right i.e. N03 (or SL03) to N00 (or SL00) one bit by one bit contrary to FIG. 23 may be applied. In this case, the range of 1-30 (decimal number) can be expressed by four block codes as well as FIG. 23. However, hereinafter it is described according to the data pattern described in FIG. 22 and FIG. 23 in order to facilitate the correspondence between the data pattern and the signal lines in the TCAM. Additionally, 0-31 (decimal number) is taken as an example for ease of explanation, however the codes for 31-255 (decimal number) can be of course defined.

<Method of Encoding and Writing Entries>

Figure 6:
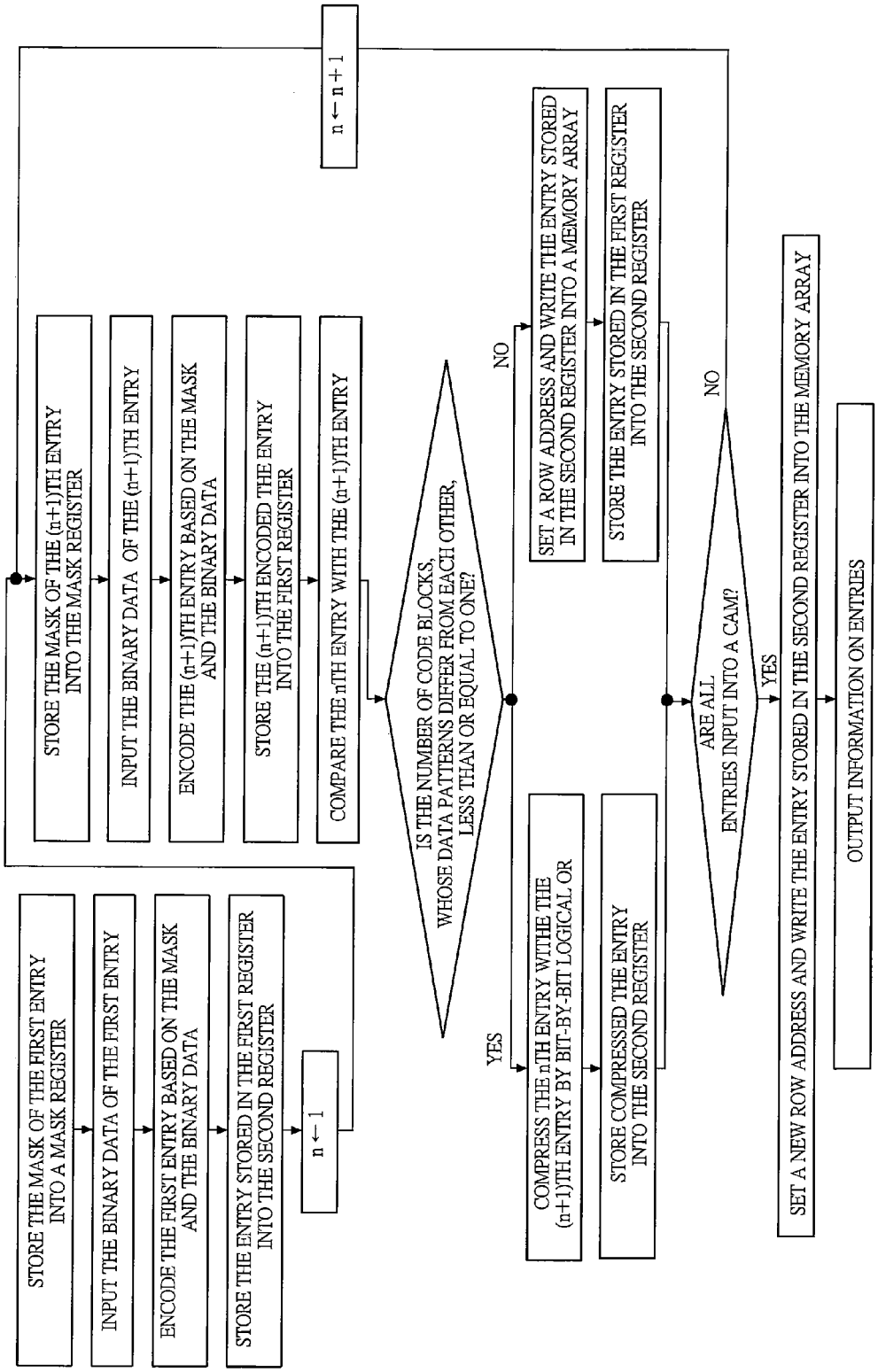
FIG. 6 is an explanatory view of an example of a method of encoding and writing the entry in the ternary content addressable memory using the memory array of FIG. 1 according to the embodiment 1.

Next, a method of encoding and writing is described with reference to FIG. 6 and FIG. 24. FIG. 6 is a flow chart of an example of the entry encoding/writing algorithm in the TCAM to perform the search operation using the code according to the present embodiment. FIG. 24 is a table of the data pattern of the mask information and the binary information corresponding to the ternary value for the range 1-30 (decimal number), and the encoded entries. Incidentally, the data pattern of the mask information and the binary information are also 8 bits, respectively. The method of encoding and writing entries has two features. The first feature is that the mask information and the binary information are inputted from outside of the chip, respectively and encoded in the chip. The second feature is that a plurality of decoded entries are compressed in the chip and the range specification which can not to be expressed by ternary values is performed. Hereinafter, the method of encoding and writing entries are described in terms of described above.

Firstly, the mask information '11111111' corresponding to 1 (decimal number) is inputted and stored in a mask register. The mask information and the code '0001 0001 0001 0010' obtained by performing the block coding as well as FIG. 22 using the binary information '00000001' which is inputted next is stored in a second temporary entry register via a first temporary entry register. Next, the mask information '11111110' for the range of 2-3 (decimal number) is inputted and newly stored in the mask register. The encoding is performed using the mask information and the binary information '00000010' inputted next, and then the bock code '0001 0001 0001 1100' is stored in the first temporary entry register. Thus the entries stored in the first and second temporary entry register are compared per bit to check the number of the code blocks having different data pattern. Where, since the different block is only BTW0, the entries stored in the first and second temporary entry register are performed the OR-operation per bit to compress two entries into one entry. The block code '0001 0001 0001 1110' obtained by compressing is newly stored in the second temporary entry register.

Next, the mask information '11111100' for the range 4-7 (decimal number) is inputted and newly stored in the mask register. The encoding is performed using the mask information and the binary information '00000100' which is further inputted and a block code '0001 0001 0010 1111' is newly stored in the first temporary entry register. Thus the entries stored in the first and second temporary entry register are compared per bit again to check the number of code blocks having different data pattern. Since the different blocks are two of BTW0 and BTW1 this time, for example the memory cell on the row address designated by an after-described next free address register is activated to write the block code '0001, 0001, 0001, 1110' stored in the second temporary entry register into the memory array. Then, the block code '0001 0001 0010 1111' held in the first temporary entry register is newly stored in the second temporary entry register. The above described operation is repeated up to 30 (decimal number) and the block code held in the second temporary entry register is written into the memory array while the row address is reset at any time. The information regarding the use condition of the memory array such as the number of entries is outputted to an external control chip such as a TCAM controller at writing the final entry, and the writing operation is completed.

Two effects can be obtained from the above described operation. The two effects are following: The first effect is that a TCAM having the interface compatible with the conventional ones can be achieved by inputting the binary information and the mask information from outside of the chip, respectively and encoding them in the chip as well as the conventional TCAM. Thereby users of TCAM can write entries as before regardless of the storage method in the chip. Additionally, in the encoding according to the present embodiment, the number of bit of the entry is doubled from 8 bits to 16 bits, however, since the encoding is performed in the chip, the data bus width required for inputting entries can be decreased so that the cost for the implementation of TCAM can be reduced.

The second feature is that a plurality of decoded entries are compressed in the chip to generate the entries in the range which can not express by the ternary value. Therefore the conventional TCAM need eight entries, however the number of entries can be reduced to four so that the entries can be efficiently stored.

So far the method of encoding and writing are described based on in the case of the entry is expanded into eight by the ternary notation. However, since the number of entries inputted is varied, the encoded entry should compressed while it is transferred to the two temporary entry registers to correctly write it to the memory array regardless of the number of entries. Therefore, especially if the number of entry is one in the ternary notation, the entry should be inputted twice. For example, in the case of only 30 (decimal number) is written, firstly the mask information '1111 1111' is inputted and stored it on the mask register. The encoding is performed using the mask information and the binary information '00011110' inputted next, and the block code '0001 0010 1000 0100' is stored in the second temporary entry register through the first temporary entry register. Next, the same information as above described information is inputted and the block code '0001 0010 1000 0100' is stored in the first temporary entry register. Thus the entries held in the first and second temporary entry registers are compared per bit to check the number of code blocks having different data pattern. In this case, the entries stored in both of the temporary entry registers are the same block codes and there is not a different code block. Accordingly, the result of the OR-operation for the entries held in the first and second temporary entry register is not changed so that the code same as before the OR-operation is stored in the first temporary entry register. Thus the block code '0001 0010 1000 0100' for 30 (decimal number) can be correctly written into the memory array.

In the search operation, the encoded search key is generated in the chip by continuously inputting the mask information and the binary information as well as the writing operation. The encoded entry is directly inputted into the memory array without through the first and second temporary entry registers.

<Method of Decoding and Reading Entries>

Figure 7:
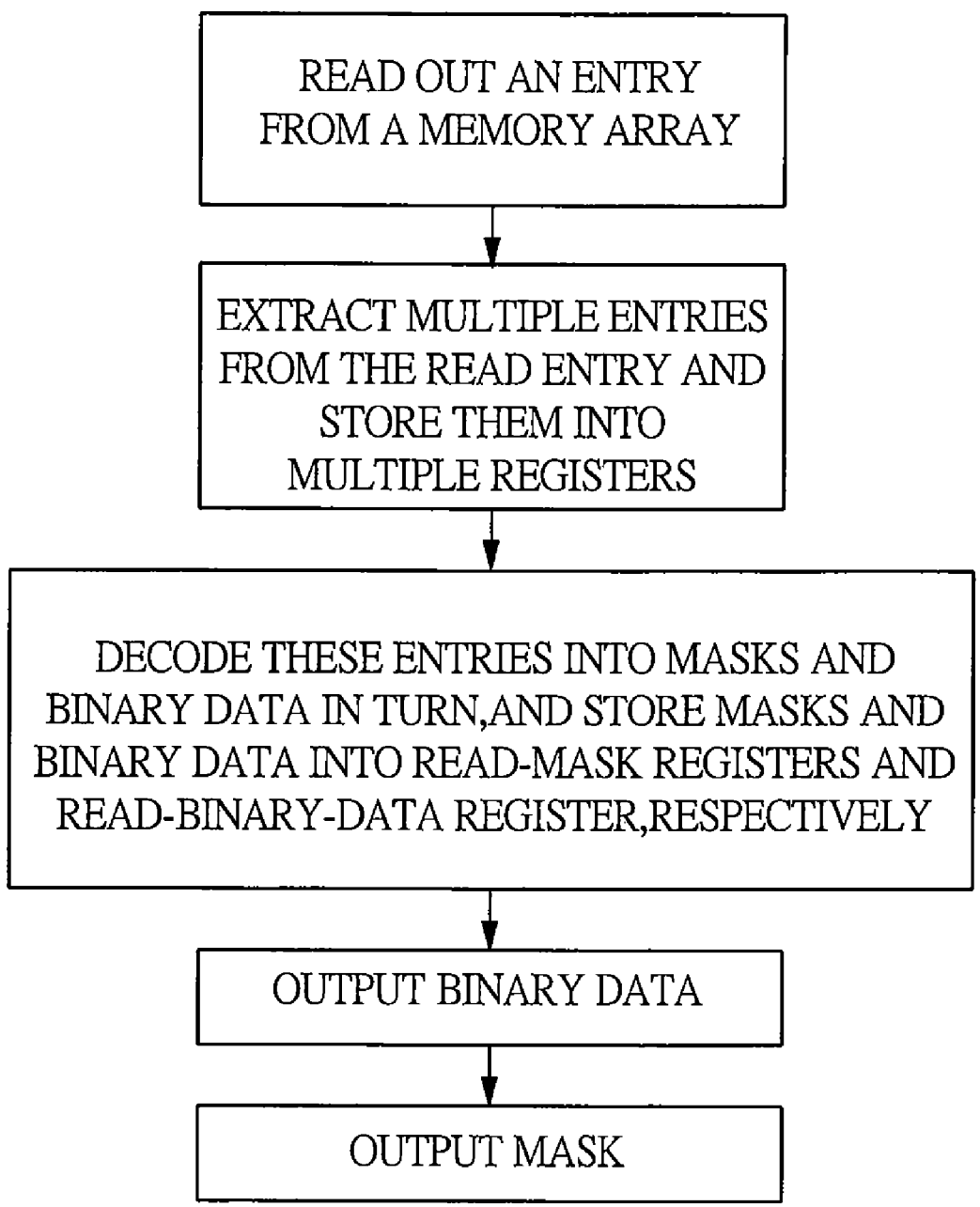
FIG. 7 is an explanatory view of an example of a method of decoding and reading the entry in the ternary content addressable memory using the memory array of FIG. 1 according to the embodiment 1.

FIG. 7 is a flowchart of the method of decoding and reading entries. The method is a reverse procedure of the encoding described in FIG. 6. Firstly, the entries read from the memory array are expanded according to the address inputted from outside of the chip and stored in a plurality of reading entry register. Next, the entries stored in the entry registers are sequentially decoded and outputted to outside of the chip through a reading information register and a reading mask register. Thus the range-specified entries can be read as the information indicating the range corresponding to the ternary value as well as the conventional TCAM.

<Whole Configuration of TCAM>

Figure 8:
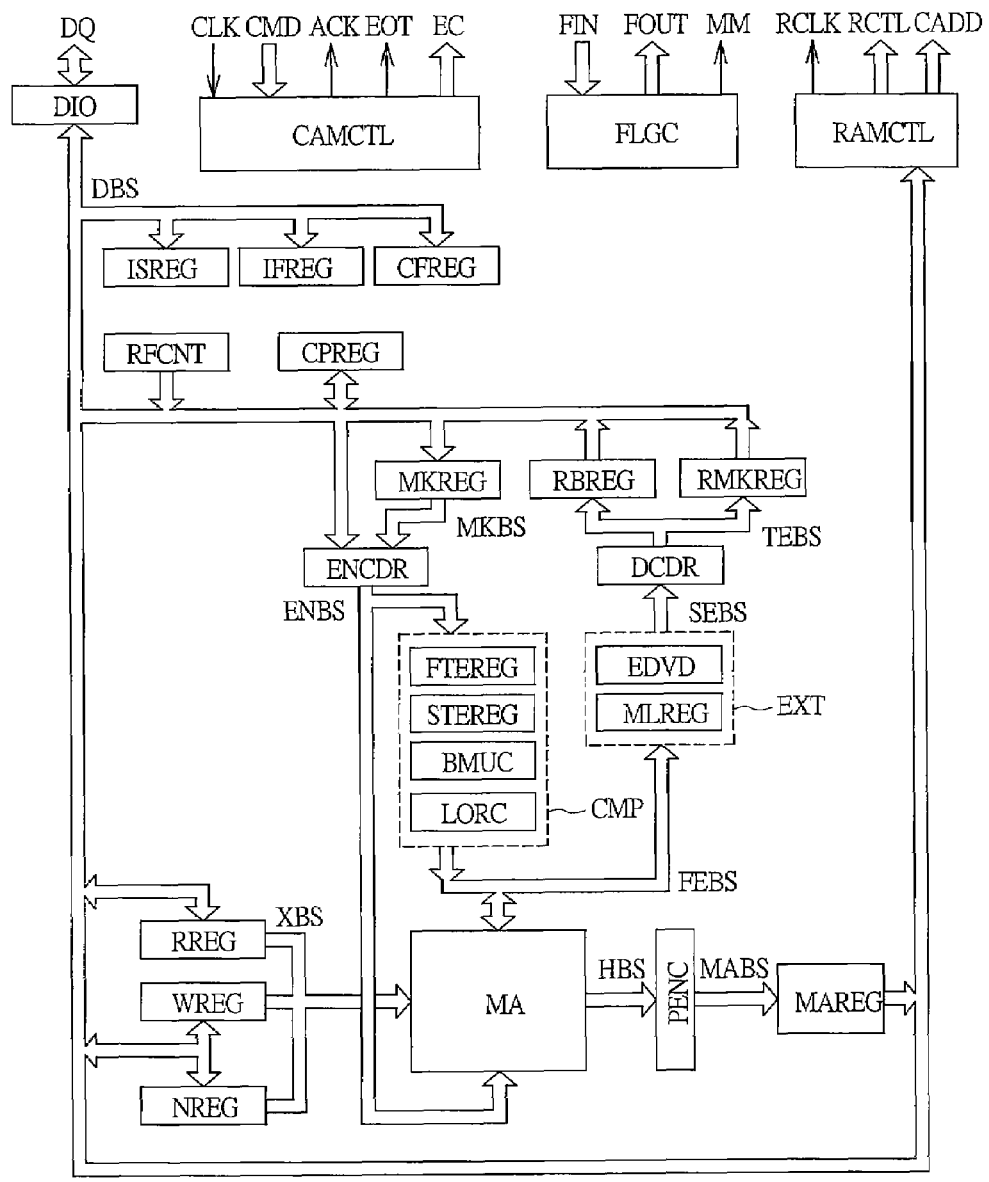
FIG. 8 is an explanatory view of a constitutional example of the substantial part block in the ternary content addressable memory using the memory array of FIG. 1 according to the embodiment 1.

Next, the whole configuration of the TCAM to perform the search operation based on the above described One-hot-spot block encoding information is described. FIG. 8 is a block diagram of the substantial part of the TCAM. The configuration comprises a memory array MA, a data input/output circuit DI0, various registers, a CAM control circuit CAMCTL, a flag logic circuit FLGC, a refresh counter RFCNT, an entry encoder ENCDR, an entry decoder DCDR, an entry compressor CMP, an entry extractor EXT, a priority encoder PENC, and a RAM control circuit RAMCTL. The memory array MA has the configuration as FIG. 1 and is described in detail after. The data input/output circuit DIO is arranged between a data bus DQ and in-chip data bus DBS and inputs/outputs the control signal which defines various setting of the chip.

Each of the various register is comprised of a plurality of bits of register corresponding to the number of signal lines of the data bus DQ. Two of a mask register MKREG and a comparand register CPREG as the registers to receive data through the data bus DBS are shown in FIG. 8. The first mask register MKREG stores the information to generate the third information 'X' and 'MASK' in the TCAM in the desired bit and inputs into the after-described entry encoder ENCDR through a mask signal bus MKBS. The comparand register CPREG stores the search key inputted by the search operation. The search key is written into the memory array MA through the above described entry compressor CMP when the corresponding entry does not exist on the search operation. Two of a reading mask register RMKRE and a reading binary information register RBREG as the registers to transmit data through the data bus DBS are also shown in FIG. 8. The first reading mask register RMKREG stores the third information 'X' received from the after-described entry decoder DCDR though a third entry bus TEBS and outputs to the data input/output circuit DIO through the data bus DBS. The second reading binary information register RBREG stores the binary information received from the entry decoder DCDR though the third entry bus TEBS and outputs to the data input/output circuit DIO through the data bus DBS as well as the reading mask register RMSKREG.

Three of a burst write register WREG, a next free address register NREG and a burst read register RREG as the registers to transmit/receive address signals through the data bus DBS are shown in FIG. 8. The first burst write register WREG stores a row address and a burst length at the first cycle on the burst write operation, and when the burst write operation is started, counts up in cooperation with the entry compressing operation to generate the addresses after second cycle. The second next free address register NREG stores the row address being empty of entry.

The third burst read register RREG stores a row address and a burst length at the first cycle on the burst read operation, and when the burst read operation is started, counts up in cooperation with the entry extracting operation to generate the addresses after second cycle. The address signals generated by these registers are inputted into the memory array MA through a row address bus XBS and outputted to outside of the chip through the data bus and the data input/output circuit.

Three of an instruction register ISREG, an information register IFREG, and a configuration register CFREG as registers to receive the control signal through the data bus DBS are shown in FIG. 8. The first instruction register ISREG stores the control signal inputted through the data bus DBS and defines a method of initializing chips, the number of continuously connected chips of the TCAM, and the table configuration of the inside of the chip. Where, the table configuration is a logical memory array configuration according to the number of entries and the number of bits of its data pattern. The second information register IFREG stores the device number unique to the chip assigned on the system such as a router. The third configuration register CFREG stores, for example, an after-described multi-match signal to control to activate the memory array MA logically divided as described above and an enable signal to define the validity of RAM clock, respectively. Additionally, a match address register MAREG inserted between an after-described match address bus MABS and the data bus DBS is also shown in FIG. 8.

The CAM control circuit CAMCTL generates a read acknowledge signal ACK, an end of transfer signal EOT, an entry count signal EC, and an internal control signal corresponding to an external clock CLK and external control signals CMD which are inputted. The external control signals CMD are generated by the external control chip using application specific integrated circuit ASIC such as the above described network processor and the search engine SE. The read acknowledge signal ACK is a strobe signal outputted in sync with the read data on reading operation. The end of transfer signal EOT is a flag signal outputted in sync with the final data on the burst read operation and the burst write operation.

The entry count signals EC are a plurality of signals indicating information regarding the entries compressed and expanded in the chip. The group of signals is sent independently or along with the above described address signal to the chips to control the TCAM such as the above described network processor NP and search engine SE of FIG. 2. Those of controllers are used to understand the compression and expansion of entries and the use condition of the memory array. Incidentally, an internal control signal is omitted in FIG. 2 for simplicity, however, a plurality of control signal are distributed among each circuit block according to the operation actually.

The flag logic circuit FLGC transmits/receives a full signal between the TCAM chips. For example, in the router, a large capacity lookup table is in general constructed by cascade-connecting a plurality of TCAMs in order to achieve a high-speed table search operation. Thereby full-in signals FIN and full-out signals FOUT is transmitted/received between the chips to keep the use condition of the memory array under control and control an input destination of the entry to be newly stored. The flag logic circuit FLGC activates a multi-match signal MM if a plurality of entries are matched on search operation.

The refresh counter RFCNT generates a row address according to refreshing operation. The row address is inputted into the memory array MA through the data bus DBS. Each of the entry encoder ENCDR, the entry compressor CMP, the entry extractor EXT and the entry decoder DCDR is a circuit block specific to the TCAM according to the present embodiment. The first entry encoder ENCDR One-hot-spot block codes entries or search keys using the third information held in the above described mask register MSKREG and the binary information inputted through the data bus DBS. The encoded information is outputted from the encoding data bus ENBS to the memory array MA on writing, and to the entry compressor CMP on search operation, respectively. The entry compressor CMP is comprised of two of a temporary entry register FTEREG and a STEREG to store the encoded entries, a comparison circuit BMUC to compare the codes of entries stored in the registers per bit and an OR-operation circuit LORC. There are connections between each circuit block, which are omitted in figure. Thereby the coded entries are appropriately temporarily stored, compared and compressed, and the compressed entries is outputted from the first entry bus FEBS to the memory array MA as described in FIG. 6. The entry extractor EXT is composed an entry dividing circuit EDVD to divide the entries read from the memory array MA through the first entry bus FEBS into the code corresponding to the range to be expressed by the ternary value, and a plurality of registers MLREG to temporarily store the divided entries. There are connections between each circuit block, which are omitted in figure. Thereby the encoded entries appropriately expanded and temporarily stored, and a plurality of the expanded entries are outputted from the second entry bus SEBS to the entry decoder DCDR as described in FIG. 7.

The entry decoder DCDR sequentially receives the entries stored in the plurality of registers MLREG in the entry extractor EXT through the second entry bus SEBS and decodes, then outputs the decoded result to the reading binary information register RBREG and the reading entry register RMSKREG, respectively through the third entry bus TEBS.

The priority encoder PENC generates an address signal corresponding to the entry matched with the search key according to the signal inputted from the match signal bus HBS on search operation. Additionally the priority encoder PENC has a function to preferentially output the address signal corresponding to the entry of the high-order (such as a row having the smallest row address number) if a plurality of entries are matched. The generated address signal is inputted into the match address register MAREG through the match address bus MABS.

Figure 2:
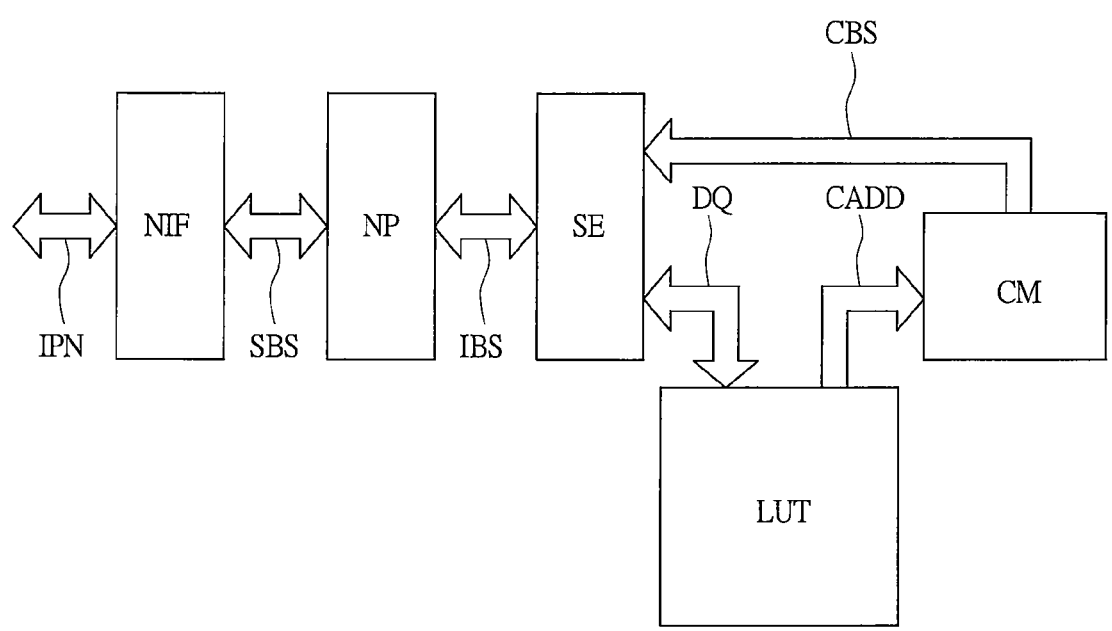
FIG. 2 is a schematic block diagram of a constitutional example of the router.
Figure 3:
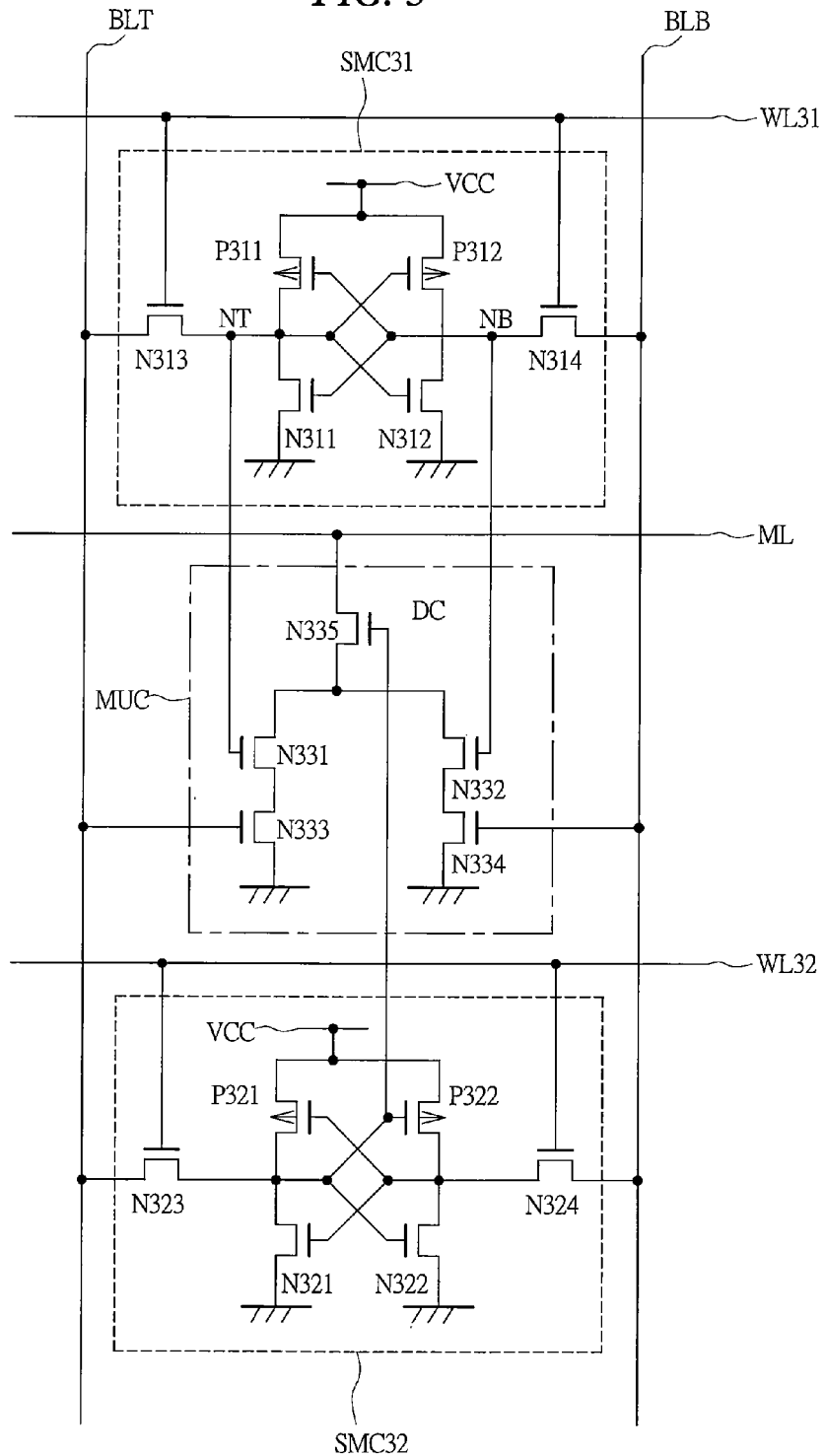
FIG. 3 is an explanatory view of the configuration of the conventional ternary content addressable memory cell comprised of seventeen transistors.

The RAM control circuit RAMCTL outputs a signal to control the content memory CM used with the TCAM described in FIG. 2 according to the signal inputted from the data bus DBS. A RAM clock RCLK, a RAM control signals RCTL and a RAM address RADD are shown in FIG. 8. The RAM control signals RCTL is comprised of a plurality of control signals such as chip enable signals and write enable signals. The RAM address RADD is an address signal generated by the above described priority encoder PENC and outputted to such as the content memory address bus CADD described in FIG. 2. If a plurality of address signals are generated, the RAM control circuit RAMCTL sequentially outputs the addresses from the match-address register MAREG through the data bus DBS.

Thus the TCAM according to the present embodiment can perform various operations as follows: Firstly, the ternary value can be converted to the one-hot-spots block code in the chip by using the entry encoder ENCDR, the entry decoder DCDR, the entry compressor CMP and the entry extractor EXT so that the TCAM compatible with the conventional ones can be achieved; Secondly, a plurality of entries can be continuously written and read by appropriately using the burst write register WREG, the next free address register NREG and the burst read register RREG; Thirdly, The information regarding the number of entries compressed and expanded, and the use condition of the memory array can be shared with the external control circuit by the address and the entry count signals EC generated by the registers so that the reliability of operation can be improved; Fourthly, the search operation can be performed by inputting the search key to the memory array through the encoding data bus EBS. Where, if the entry to be matched with the search key is found, the address signal corresponding to the entry is generated by the priority encoder PENC and outputted to the content memory through the match address register MAREG and the RAM control circuit RAMCTL; Fifthly, the refreshing operation can be performed by inputting the row address generated using the refresh counter RFCNT to the memory array MA through the data bus DBS.

<TCAM Array Configuration>

FIG. 1 is an example of the configuration of the TCAM array to perform the search operation using One-hot-spot block coding information according to the present invention. The feature of the memory array is that the match line forms the hierarchical structure consisting of main-match lines and sub-match lines. Hereinafter the memory array configuration is described in view of such feature.

Each memory cell is arranged at each intersecting point of a plurality of word lines WLm (m=0, 1, - - - ) and a plurality of bit lines BLni (n=0, 1 - - -, i=0, 1, 2, 3). A plurality of corresponding search lines SLni (n=0, 1 - - -, i=0, 1, 2, 3) are arranged in parallel with the bit lines BLni (n=0, 1 - - -, i=0, 1, 2, 3), respectively. A plurality of corresponding main-match lines MMLm (m=0, 1 - - - ) are arranged in parallel with the word lines WLm (m=0, 1, - - - ), respectively. Further, a plurality of sub-match lines SMLmj (m=0, 1 - - - , j=0, 1 - - - ) are arranged in parallel with the corresponding main-match lines MMLm (m=0, 1 - - - ), respectively. Four of memory cell Mci (i=0, 1, 2, 3) are connected to the sub-match lines, respectively as the sub-match line SML01 for example. Hereinafter a group consisting of the four memory cells Mci (i=0, 1, 2, 3) is designated as memory block MBmj (m=0, 1 - - - , j=0, 1 - - - ), respectively. Sub-match detectors SMDmj (m=0, 1 - - - , j=0, 1 - - - ) are arranged between the sub-match lines SMLmj (m=0, 1 - - - , j=0, 1 - - - ) and the corresponding main-match lines MMLm (m=0, 1 - - - ), respectively. The sub-match detectors precharge the corresponding sub-match lines and discriminate a small signal generated by the sub-match lines.

A direct peripheral circuit to control the TCAM is also shown in FIG. 1. The row decoder XDEC selects the word line corresponding a plurality of row address signals inputted through the above described row address bus XBS among the plurality of word lines WLm (m=0, 1 - - - ). The main-match detector block MMDB precharges the match lines MLm (m=1, 2 - - - ), discriminates a small signal generated by the match lines and outputs a signal generated according to the detection result of a small signal to the above described match signal bus HBS. The search line drive circuit block SDB is arranged between the above described encoding data bus ENBS and the search lines SLni (n=0, 1 - - - , j=0, 1, 2, 3) and drives the search lines to the voltage according to the logic value of the encoded search key. A read/write circuit block RWB is arranged between the above described the first entry bus FEBS and bit lines BLni (n=0, 1, - - -, i=0, 1, 2, 3) and reads/writes the entries encoded and compressed. Specifically, the configuration is well known as a semiconductor memory such that the sense amplifiers configured using the circuit in which two PMOS transistors and two NMOS transistors are cross-coupled are arranged per bit line.

Figure 9:
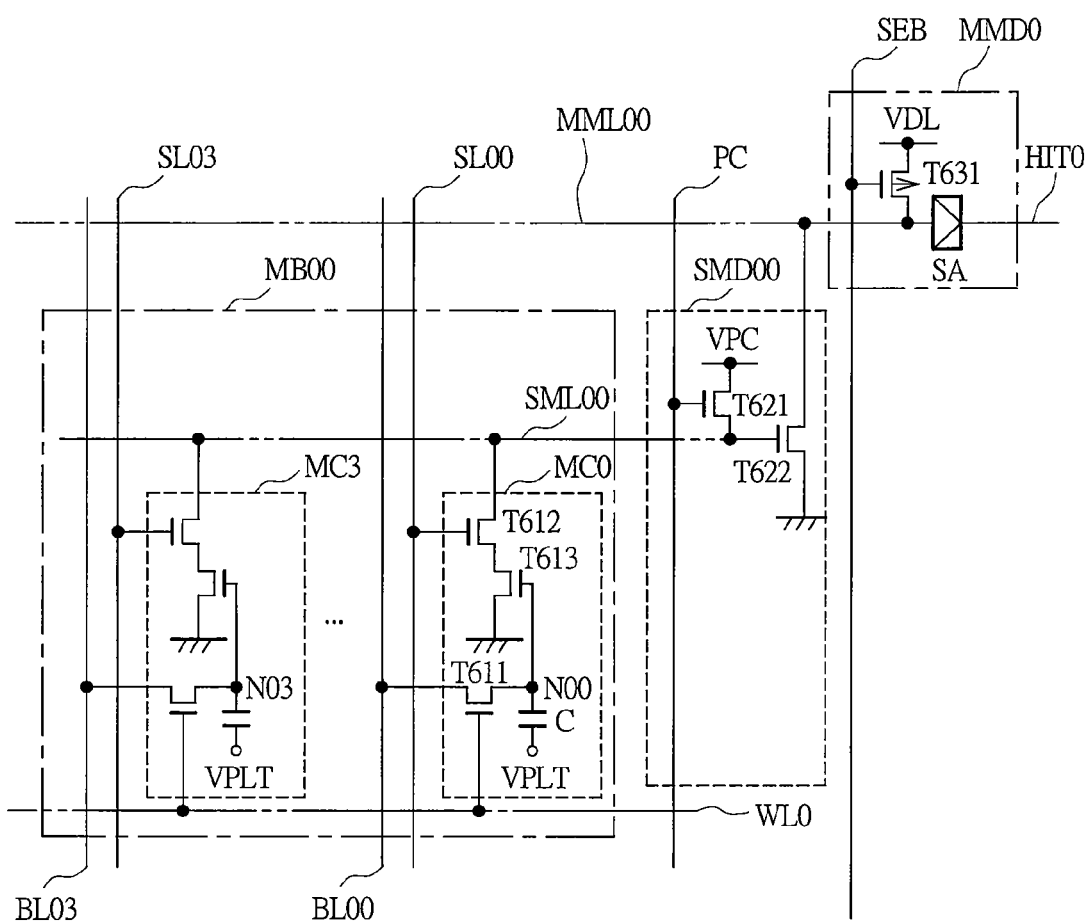
FIG. 9 is an explanatory view of the specific constitutional example of the circuit block in the memory array of FIG. 1 according to the embodiment 1.

Next, the definite constitutional example of the circuit blocks in the memory array configuration of FIG. 1 with reference to FIG. 9. Where, a memory block MB00 is mainly taken, and the associated with sub-match detector SMD00 and the main-match detector MMD0 being as a component of the main-match detector block MMDB are shown in FIG. 9 for ease of the explanation. Hereinafter a ground voltage is VSS, an array voltage is VDL, a precharge voltage of the sub-match line is VPC. The array voltage is higher than the ground voltage VSS, however where, it is set to the voltage equal to or less than the source voltage VDD. The precharge voltage VPC is higher than the ground voltage VSS, however where it is set to the voltage equal to the array voltage VDL, or less than the array voltage VDL to such a degree that the NMOS transistor is sufficiently conductive.

Firstly, the memory cell MCi (i=0, 1, 2, 3) constituting the memory block MB00 is comprised of three NMOS transistors and one capacitor. A transistor T611 and a capacitor C have same configuration as the well-known memory cell of DRAM and store entries. The gate electrode of the transistor T611 is connected to the word line WL0, any one of drain electrode or source electrode is connected to the corresponding bit line BL0i (i=0, 1, 2, 3) and the other is connected to one electrode of capacitor C, respectively. The other electrode of the capacitor C is supplied with so-called plate voltage VPLT. A transistor T613 and a transistor T612 are serially connected between the sub-match line SML00 and the ground electrode and compare information. The gate electrode of the transistor T612 is connected to the corresponding search line, and the gate electrode of the transistor T613 is connected to one electrode of the capacitor C, respectively. Since the memory cell having such configuration stores by storing charge in one electrode of the capacitor C, the connecting nodes between the transistor T611, T613 and capacitor C will be referred to as storage nodes. The storage nodes are clearly designated as N0i (i=0, 1, 2, 3) corresponding to the memory cells Mci (i=0, 1, 2, 3) in order to distinguish the storage nodes per memory cell in FIG. 9.

The sub-match detector SMD00 is comprised of two NMOS transistors T621 and T622. The transistor T621 charges the sub-match line SML00 to the precharge voltage VPC. The gate electrode is connected to a precharge seizing signal line PC, and the drain electrode is connected to the sub-match line SML00, respectively, then the source electrode is supplied with the precharge voltage VPC. The other transistor T622 drives the main-match line MML0 according to the voltage variation of the sub-match line. The gate electrode is connected to the sub-match line SML00, and the drain electrode is connected to the main-match line MML0, respectively. The ground voltage VSS is applied to the source electrode. Since the gate electrode is supplied with the precharge voltage VPC in standby state, the transistor T622 is conductive thereby to be able to precharge the main-match line MML0 to the ground voltage VSS. Incidentally, the transistor T621 may be PMOS transistor, however since a plurality of well separation are required in the memory array, the area is increased. Therefore, the NMOS transistor is more appropriate from the view point of the reduction of area.

The main-match detector MMD0 is comprised of a PMOS transistor T631 and a sense amplifier SA. The transistor T631 applies a current to the main-match line MML0 on the search operation. The gate electrode is connected to the search enable signal line SEB, and the drain electrode is connected to the main-match line MML0, respectively, then the source electrode is supplied with the array voltage VDL. The sense amplifiers SA are configured using the circuit in which such as well known as a semiconductor memory, two PMOS transistors and two NMOS transistor are cross-coupled. The sense amplifiers discriminate a little voltage generated in the main-match line MML0 and drive the match signal HITO according to the voltage level. The gate length and gate width of the transistor T631 and transistor T622 in the sub-match detector SMD00 are set to the voltage level such that the voltage of the main-match line MML0 when the transistor T631 and T622 are conductive is close to the ground voltage VSS.

Next, the search operation using such configuration. Firstly, if the search key and the entry are matched, since the memory cell that both logical values of the corresponding search line and the storage node are '1' exist in all of the memory blocks on the same word line, all of the corresponding sub-word lines are discharged by being conductive the transistor T612 and T613. Therefore, the transistor T622 in the corresponding sub-match detector is cut off so that the corresponding main-match line driven to the ground voltage VSS is charged by the transistor T631 in the main-match detector. Alternatively, if the search key and the entry are not matched, all of the logical values of the corresponding search lines and the storage nodes are the opposite polarity in any memory block on the same word line so that a current path is not formed between the sub-match line of the block and the ground electrode thereby the corresponding sub-word line is kept at the precharge voltage VPC. Therefore, the transistor T622 in the corresponding sub-match detector is conductive so that the main-match line is kept at approximately the ground voltage VSS. The voltage variation of these main-match lines is discriminated by the sense amplifiers SA in the main-match detector to determine the result of comparison.

Incidentally, the condition of the unused memory cell is not limited unless it effects on other memory cells, but the information corresponding to the logical value '0' is stored preferably. In this case, since the transistor T613 in the memory cell is cut off, it is possible to prevent the sub-match lines from discharging on the entry search operation so that the power consumption of the sub-match line corresponding to the word line which does not store the entry (where, it is IP address) can be reduced.

Next, the search operation of the TCAM cell having the configuration of FIG. 1 and FIG. 9 is described in detail based on the above described principle.

<Search Operation>

Hereinafter, the voltage applied to the precharge seizing signal line PC is assumed same as the step-up voltage applied to the word lines and it is designated as VPP. The step-up voltage VPP is higher than the array voltage VDL and it is set such that the difference from the array voltage is more than the threshold value of NMOS transistor. The reference voltage used by the sense amplifier SA in the main-match detector to discriminate a little voltage is designated as VREF. The reference voltage VREF is set to the voltage level between the ground voltage VSS and the array voltage VDL. The storage node in the memory cell is driven to the source voltage VDD or the ground voltage VSS. High voltage level may be set to the array voltage VDL, however the source voltage VDD higher than the array voltage VDL is more appropriate in order to certainly read the storage information while enough reading signals are generated. Additionally, since the high voltage of the search lines may as well set to the voltage lower than the source voltage VDD as described after in order to reduce the power consumption on the search operation, preferably the high voltage of the storage nodes is set to other than the array voltage VDL. The search operation is described based on these setting.

Firstly, the search operation when the search key and the entry are matched is described with reference to FIG. 10. Where, it assumes that the configuration of the memory array of FIG. 1 has two memory blocks for each word line for ease of explanation. It assumes that the entries corresponding to the range 1-3 (decimal number) are stored on the interest word line WL0 and compared with the search key corresponding to 1 (decimal number). Therefore, the storage node N00 in the memory block MB00 and the storage nodes N11-N13 in the memory block MB01 are kept at the ground voltage VSS, and the storage nodes N01-N03 in the memory block MB00 and the storage node N10 in the memory block MB01 are kept at the source voltage VDD according to the block-coded entry '0001 1110' in FIG. 10.

Firstly, since the transistor T621 in the sub-match detector is conductive by driving the precharge seizing signal line PC to the step-up voltage VPP in the standby state, the sub-match line SML10 and SML00 are driven to the precharge voltage VPC, respectively. Where, since the precharge voltage VPC is the voltage level enough to be conductive the transistor T622 in the sub-match detector as described above, the main-match line MML0 is driven to the ground voltage VSS.

Upon starting the search operation, the precharge seizing signal line PC with the step-up voltage VPP is driven to the ground voltage VSS and the search line with the ground voltage VSS is driven to the array voltage VDL according to the search key after the sub-mach line is stopped precharging. In FIG. 9, the search line SL01 and SL10 with the ground voltage VSS are driven to the array voltage VDL while the search lines SL00, SL02-SL03 and SL11-SL13 are kept at the ground voltage VSS, respectively according to the encoded search keys '0001 0010'. Where since both of the transistor T612 and T613 are conductive in the memory cell MC1 in the memory block MB00 and the memory cell MC0 in the memory block MB01, the sub-match line SML00 and SML01 with the precharge voltage VPC are discharged, respectively. Therefore, the transistor T622 in the sub-match detector is cut off. In this state, if the search enable signal line SEB with the array voltage VDL is driven to the ground voltage VSS, the transistor T631 in the main-match detector MMD0 is conductive so that the main-match line MML0 with the ground voltage VSS is charged to the array voltage VDL. At the time the main-match line MML0 is charged to the voltage sufficiently higher than the reference voltage VREF, the sense amplifier determines that the entry and the search key are matched by discriminating these potential difference and drives the match signal HITO (not shown in the figure) to the voltage according to the result of comparison. Finally, the search enable signal SEB with the ground voltage VSS is driven to the array voltage VDL, and the search line with the array voltage VDL is driven to the ground voltage VSS, respectively, further the precharge seizing signal PC with the ground voltage VSS is driven to the step-up voltage VPP so that the sub-match line SML00 and SML01 are driven to the precharge voltage VPC, and the main-match line MML0 is driven to the ground voltage VSS, then the operation is returned to the standby state again.

Next, the search operation when the search key and the entry are not matched is described with reference to FIG. 11. Where, it is assumed that the entries corresponding to the range 1-3 (decimal number) are stored on the word line WL0 and compared with the search key corresponding to 0 (decimal number) as well as FIG. 10. The precharge operation and the drive timing of each signal are same as FIG. 10 and the description is omitted.

Upon starting the search operation, the search lines SL00 and SL10 with the ground voltage VSS are driven to the array voltage VDL while the search lines SL01-SL03 and SL11-SL13 are kept at the ground voltage VSS according to the encoded search key '0001 0001'. Since both of the transistor T612 and T613 are conductive in the memory cell MC0 of the memory block MB01, the sub-match line SML01 with the precharge voltage VPC is discharged. However, since the transistors to be conductive in the memory block MB00 are the transistor T612 in the memory cell MC0 and the transistor T613 in the memory cell MC1-MC3, a current path between the sub-match line SML00 and ground electrode is not formed in any memory cell. That is to say, the sub-match line SML00 is kept at the precharge voltage VPC and the transistor T622 in the sub-match detector SMD00 is still conductive. Therefore, when the search enable signal SEB is activated, the main-match line MML0 is driven to the voltage which is determined by the resistance division of the transistor T631 in the main-match detector MMD0 and the transistor T622 in the sub-match detector SMD00. Since the voltage level is close to the ground voltage VSS as described above, it does not exceed the reference voltage VREF. The sense amplifier in the main-match detector determines that the entry and the search key are not matched by discriminating these potential difference and drives the match signal HITO (not shown in the figure) to the voltage according to the result of comparison. FIG. 25 is a table of the voltages of the sub-match lines and the main-match lines on the search operation.

According to the above described configuration and operation, the memory array of FIG. 1 and FIG. 9 obtains two effects as follows: Firstly, the number of the transistors connected to the sub-match lines and the main-match lines are decreased so that it is able to prevent the operation speed from reducing; Secondly, the search operation using the encoded information can be performed while the ternary information is received as well as the conventional TCAM.

So far the search operation with the search key which is block-coded for the rage-specified entry and binary value, respectively is described. However, the search key is not limited to that. The search operation with the search key which is encoded for the range-specified ternary value of course may be applied.

Figure 10:
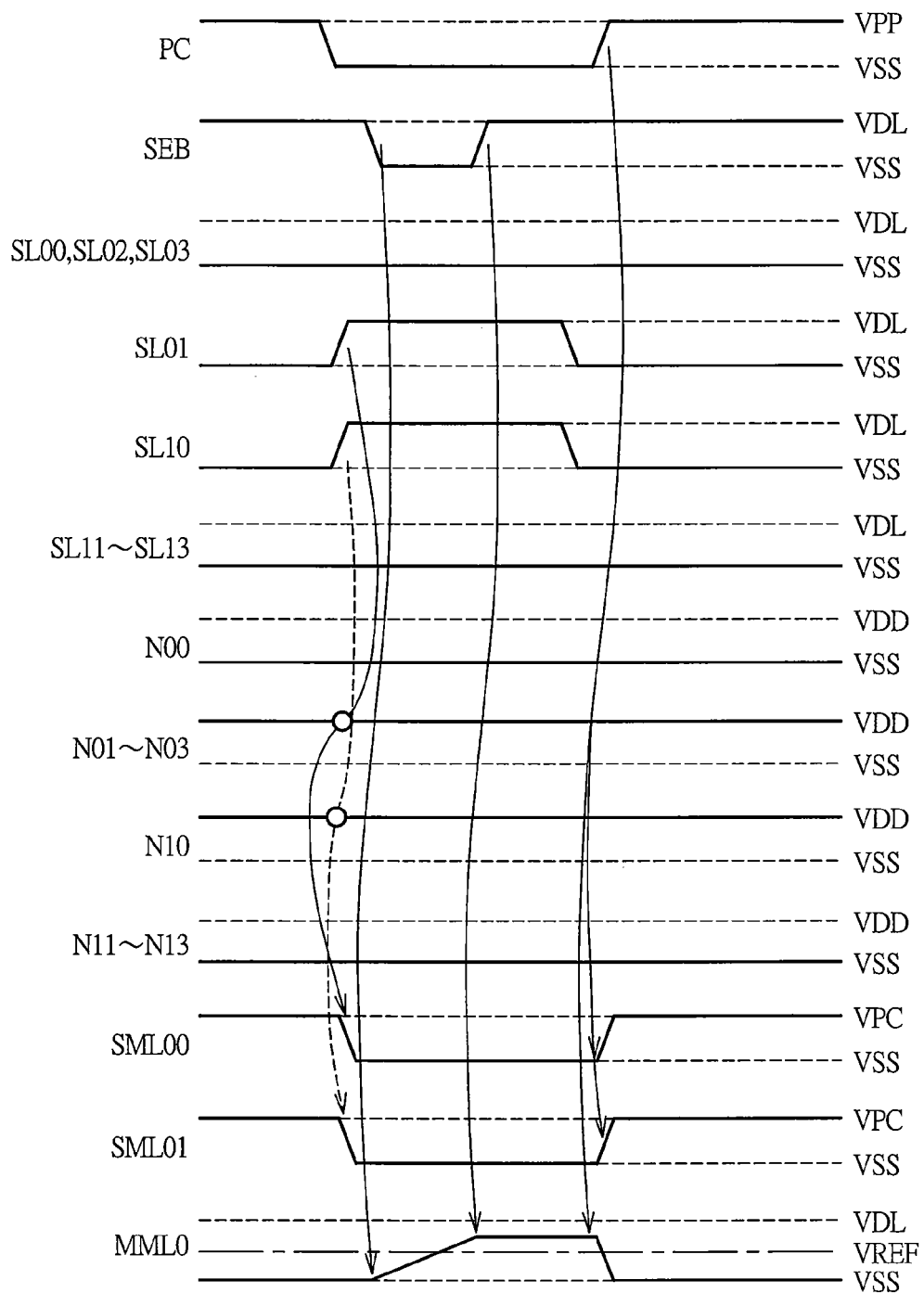
FIG. 10 is an explanatory view of an example of the operation timing on the matched information search in the memory array of FIG. 1 according to the embodiment 1.
Figure 11:
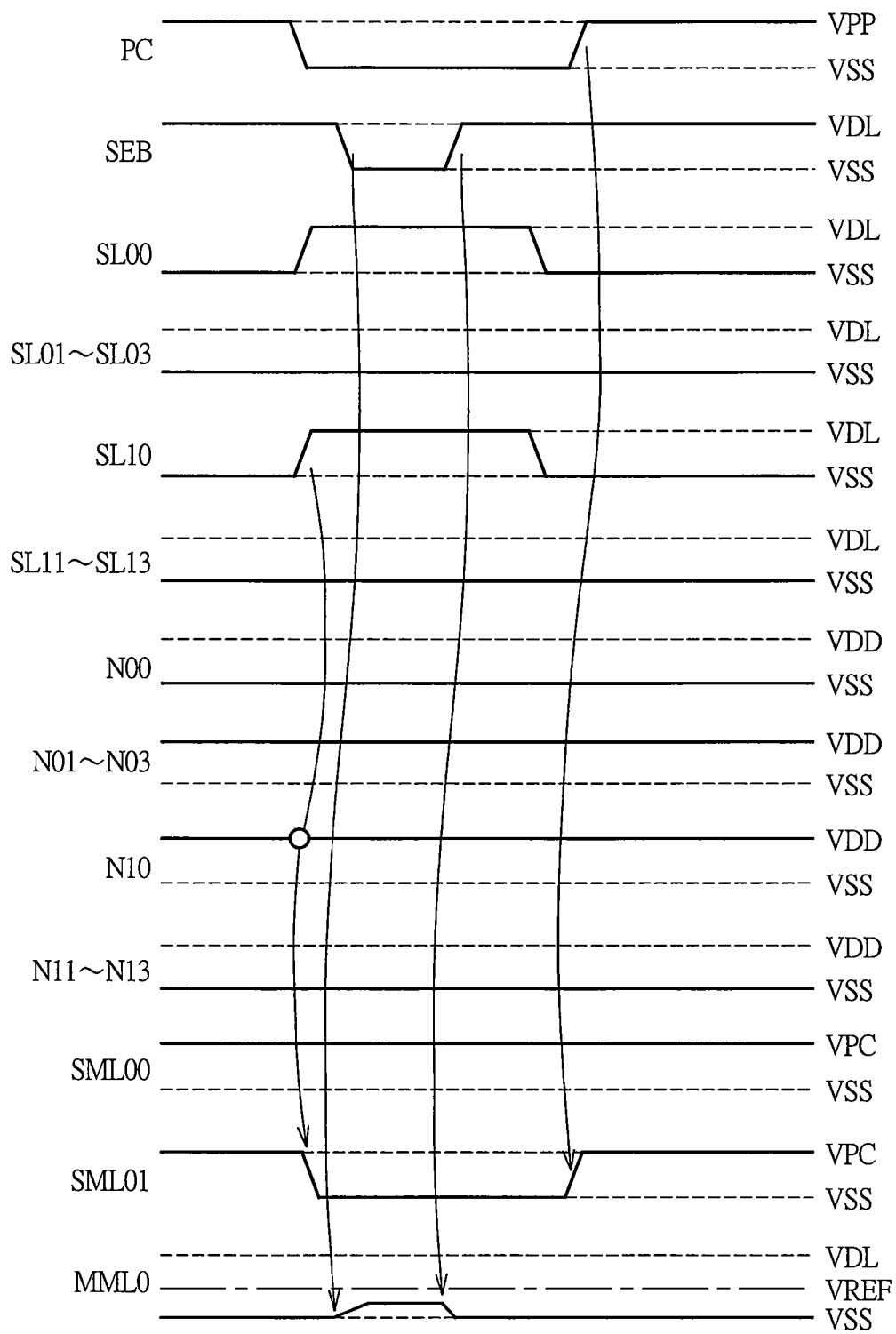
FIG. 11 is an explanatory view of an example of the operation timing on the mismatched information search in the memory array of FIG. 1 according to the embodiment 1.

In FIG. 10 and FIG. 11, the reference voltage VREF is set based on the assumption that the configuration of the sense amplifier in the main-match detector MMD0 is the cross-coupling type as described above. However, the configuration of the sense amplifier is not limited that, and an inverter circuit in which the logic threshold is set to the reference voltage VREF may be applied. In this case, since the number of the transistors constituting the circuit is small, the area of the sense amplifier can be reduced. Additionally, since the seizing signal of the sense amplifier can be eliminated, the timing is easily set up.

Figure 4:
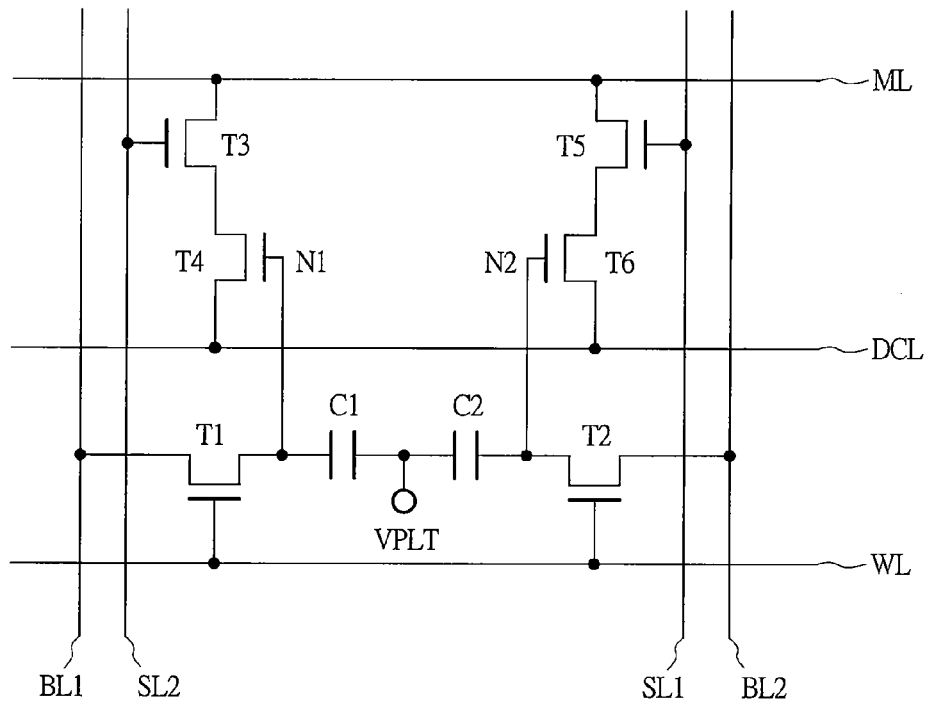
FIG. 4 is an explanatory view of another configuration of the conventional ternary content addressable memory cell comprised of six transistors and two capacitors.

Further, the number of memory cells in the memory block of the FIG. 1 and FIG. 9 is different depending on the number of the bit unit when the input information and the comparison information are encoded. In FIG. 1 and FIG. 9, the memory array is encoded in units of 2 bits so that the memory block is grouped of four ($2^2$) memory cell MCi (i=0, 1, 2, 3). The memory block has the circuit configuration corresponding to the twin TCAM cell described in FIG. 5. Therefore, in the present embodiment, the coding method and the memory array configuration are exercised ingenuity so that the memory array in which the information to be stored in one TCAM is increased from the ternary value to the quaternary value using two TCAM cell to store the ternary information described FIG. 4 can be achieved. Thus the numbers being able to express by one entry is increased as described in FIG. 22 nevertheless the number of memory cells is not changed so that the information can be efficiently stored.

Effects of the Present Embodiment

The effect of the above described One-hot-spot block code, and the configuration and the operation of the TCAM are as follows:

The first effect that so-called One-hot-spot block coding defined such that the positional difference of logical value '1' is taken on the meaning is employed thereby the amount of information to be stored in one entry is increased as described in FIG. 22 so that the number of entries required to store the range-specified IP addresses is decreased than before. Comparing with the conventional TCAM cell configuration as FIG. 4, since the amount of the storage information is increased from the ternary value to the quaternary value by the code according to the present embodiment so that the range-specified IP addresses are efficiently stored thereby the memory capacity of the TCAM can be substantially increased. Since only one logical value '1' is included in the data pattern of the code according to the present embodiment corresponding to the binary value, the charge/discharge power of the search lines on the search operation can be reduced. Additionally, the utilization ratio of the memory array is improved so that the number of word lines which do not store the entry (where it is IP address) is increased. Further the storage information of the corresponding memory cell is the value corresponding to the logical value '0' so that it is able to prevent the corresponding sub-match line from discharging thereby the power consumption per memory array on the search operation can be reduced.

The second effect is that the entry encoder ENCDR, the entry decoder DCDR, the entry compressor CMP and the entry extractor EXT are built-in each chip as described in FIG. 8 so that the conversion between the ternary value and the one-hot-spot block code can be performed in the chips. The number of bits of entries and search keys is increased than the input information by the encoding according to the present embodiment, however, since the encoding/decoding are performed in the chips, the bus width of the data bus DQ is maintained so that the TCAM having the interface compatible with the conventional ones can be achieved.

The third effect is that the match line is hierarchically structured by the sub-match line and the main-match line as described in FIG. 1 and FIG. 9 so that the code common to the entry and the search key can be used. Thereby the search operation with the search key as the range-specified information that is not be able to achieve by the conventional twin TCAM cell as described in FIG. 5 can be achieved. Additionally, the number of transistors connected to the sub-match lines and the main-match lines are decreased so that each load capacity is decreased thereby it is able to prevent the operation speed from reducing.

So far regarding the specification of the NMOS transistors used for the memory array is not particularly mentioned, incidentally a transistor N611 in the memory cell MC of FIG. 9 is designed as the gate oxide thickness being well known as a transfer gate in the memory cell of a general purpose DRAM in consideration of the resist pressure. Additionally the concentration of the impurity in the channel is set at a high level in order to prevent to leak the stored charge in the storage node. Thus the threshold voltage of the transistor N611 is preferably set to the level higher than the threshold voltage of the transistor used for the logic circuits arranged around the memory array. Meanwhile, since the transistor N622 and the transistor N623 in the memory cell MC are used for the comparison operation, the switching operation is preferably accelerated. Accordingly, the threshold voltage is decreased by adjusting the concentration of the impurity in the channel thereby the resistance and the diffusion capacitance are preferably set to low on conductive state to shorten the search time. A transistor N621 in the sub-match detector is also the gate oxide thickness in consideration of the resist pressure in order to apply the step-up voltage VPP to the gate electrode. Additionally, since the transistor N622 is the element involved with the search operation, the threshold voltage is preferably set to a low voltage from the view point of shortening the search time. Incidentally the transistor can be conductive nevertheless the voltage applied to the gate electrode is low by reducing the threshold voltage. Therefore, the precharge voltage VPC is reduced so that power of charge/discharge of the sub-match line can be decreased.

Embodiment 2

Figure 12:
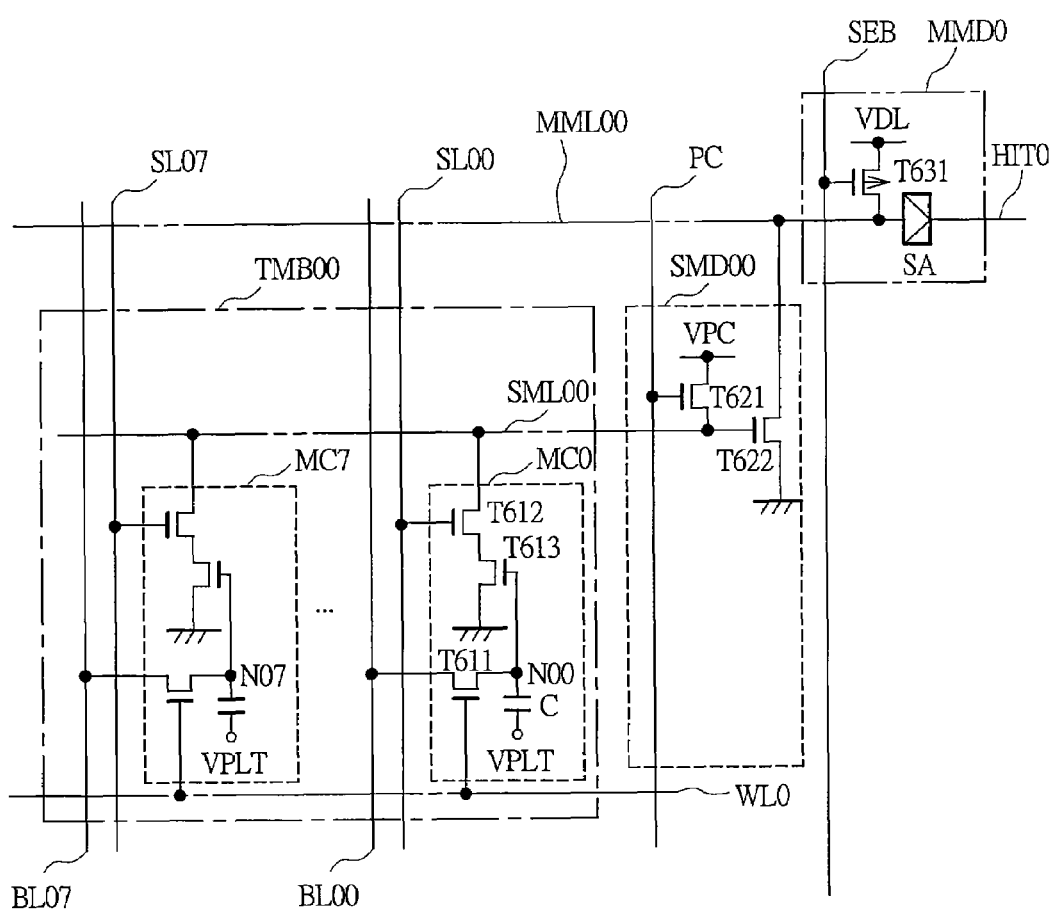
FIG. 12 is an explanatory view of another constitutional example of the memory block in the memory array of FIG. 1 according to the embodiment 2.

Another embodiment of the memory array configuration of the TCAM to perform the search operation for the information using the One-hot-spot block code described in the embodiment 1 is described. The feature of the configuration is that the memory block is comprised of eight memory cells while the encoding is performed in units of 3 bits. A memory block TMB00 comprised of eight memory cells MCi (i=0, 1 - - - , 7), which is corresponding to FIG. 9 in view of the feature is shown in FIG. 12. Each code for 0-31 (decimal number) is shown in FIG. 26 corresponding to FIG. 23. The code corresponding to the 8 bits of binary value is expressed as the data pattern consisting of 24 bits of code in which a code of 8 bits per block ($=2^3$ bits) is repeated 3 times. Where, three code blocks are designated as BTD2, BTD1 and BTW0 in descending order from the left. The components of the code block BTDi (i=0, 1, 2) are expressed as such that the entry is (Ni7, Ni6, - - - Ni0) in descending order from the left, and the search key is (SLi7, SLi6, - - - SLi0) . Hereinafter a blank is inserted between each code block in order to clearly exhibit to be encoded in units of 3 bits.

Firstly, One-hot-spot block codes for 0-7 (decimal number) are defined. The data pattern of the code block BTD0 is that the logical value '1' is shifted from N00 (or SL00) to N07 (or SL07) 1 bit at a time as FIG. 23. All the data pattern of the code blocks BTD1 and BTD2 are '00000001'.

Next, the data patterns for 8-15 (decimal number) are such that the logical value '1' in the code block BTD0 is shifted from N00 (or SL00) to N07 (or SL07) again one bit by one bit while the logical value '1' in the code block BTD1 is shifted to the left from N10 (or SL10) to N11 (or SL11) by 1 bit. As described above, subsequently the block code for 16-31 (decimal number) is defined such that the shift of the logical value '1' in the code block BTD0 is repeated while the logical value '1' in the code block BTD1 is shifted to the left by 1 bit every time the decimal number increases by eight.

Next, the data pattern for a plurality of numbers is described below taken the range 1-30 (decimal number) as an embodiment. Firstly, the block BTD0 is brought together for the range of 1-7 (decimal number) and expressed as the code '00000001 00000001 11111110' as well as the encoding in units of 2 bits described in FIG. 23. Next, the block code for the range 8-23 (decimal number) is expressed as the code '00000001 00000110 11111111' by performing the OR-operation for each bit of the corresponding block code. Finally the range of 24-30 (decimal number) is expressed as the code '00000001 00001000 01111111', thereby the range of 1-30 (decimal number) is expressed by three block codes. This number is small by one than the encoding in units of 2 bits described in FIG. 23. Therefore, the number of entries required for storing the range-specified entries can be reduced by increasing the bit unit for encoding thereby to store effectively. Additionally since the utilization ratio of the memory array is improved, the number of word lines which do not store the entry is increased as well as the embodiment 1 so that it is able to prevent the corresponding memory cell from discharging thereby the power consumption per memory array on the search operation can be reduced.

Regarding the code according to the present invention, only one logical value '1' is included in the data pattern of the search key encoded corresponding to the binary value as well as the encoding in units of 2 bits in FIG. 23. Additionally, since the bit unit for encoding is increased, the charge/discharge power of the search lines on the search operation can be decreased. So far the code with the data pattern that the logical value '1' is shifted to the left by 1 bit every time the decimal number is increased by 1 has been described. However, the data pattern is not limited to that and other data patterns may be applied. For example, the data pattern such that the logical value '1' in the code block BTD0 for 0-7 (decimal number) is shifted to the right i.e. N07(or SL07) to N00(or SL00) one bit by one bit contrary to FIG. 26 may be applied. In this case, the range of 1-30 (decimal number) can be expressed by three block codes as well as FIG. 26. Additionally, 0-31 (decimal number) is taken as an example for ease of explanation, however if the data patterns of the adjacent low-order code blocks (where, block BTD0 and BTD1) reaches '10000000' together, the logical value '1' in the immediate upper code block (where, block BTD2) is shifted to the left (where, from N30(or SL30) to N31(or SL31)) by 1 bit, while the data pattern of the code block BTD0 and BTD1 are assigned again. Thus the procedure is enlarged so that the block codes for 31-255 (decimal number) can be defined.

Embodiment 3

Next, another embodiment of the memory array configuration, especially, sub-match detector of the TCAM to perform the search operation using the One-hot-spot block code described in the embodiment 1 is described. The object of the present embodiment is that a code and a circuit configuration such that all of the corresponding search lines are not driven when all of the plurality of bits divided to block-code are the third information 'x' (so-called masking) in the search key in the ternary notation is provided. Specifically, in the case of it is a block code in units of 2 bits, if the information 'XX' (all values of 0-3 (decimal number)) in the ternary notation is inputted as the search key, the code in which all of the bits are the logical value '1' is obtained as FIG. 22 so that all of the corresponding search lines are activated. Accordingly, the number of the search lines driven is increased in the configuration of the embodiment 1 so that the power consumption on the search operation has to be increased. In order to solve such problem, the circuit configuration such that the search operation can be correctly performed while the code corresponding the information 'XX' is '0000' and the corresponding search line is kept in the standby state is provided in the present embodiment.

Figure 13:
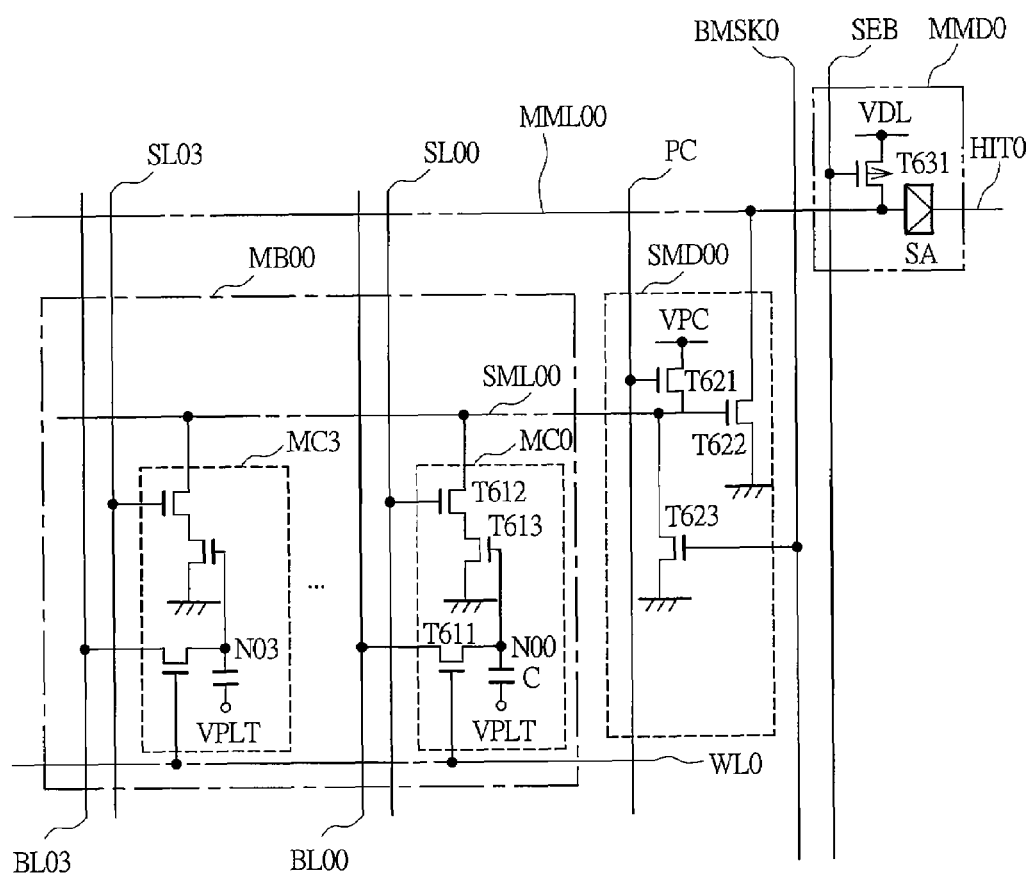
FIG. 13 is an explanatory view of another constitutional example of the sub-match detector in the memory array of FIG. 1 according to the embodiment 3.

FIG. 13 is a part of the memory array of the present embodiment, which is corresponding to FIG. 1 and FIG. 9. The difference between FIG. 13 and FIG. 9 is that a NMOS transistor T623 is newly added in the sub-match detector SMD00. A block mask signal BMSK0 is connected to the gate electrode of the transistor T623, and the sub-match line SML00 is connected to the drain electrode, respectively. The source electrode is grounded. The correspondence between the search lines SL0$i$ (i=0, 1 - - - , 3) and the block mask signals BMSK0 is expressed in the case of 0-3 (decimal number) in FIG. 27. The difference of the code defined by the search key from FIG. 22 is that all of the data pattern for 0-3 (decimal number) is changed from '1111' to '0000'. The logical value of the block mask signal is '1' only for the search key designated to the range 0-3 (decimal value) according to the change.

Figure 14:
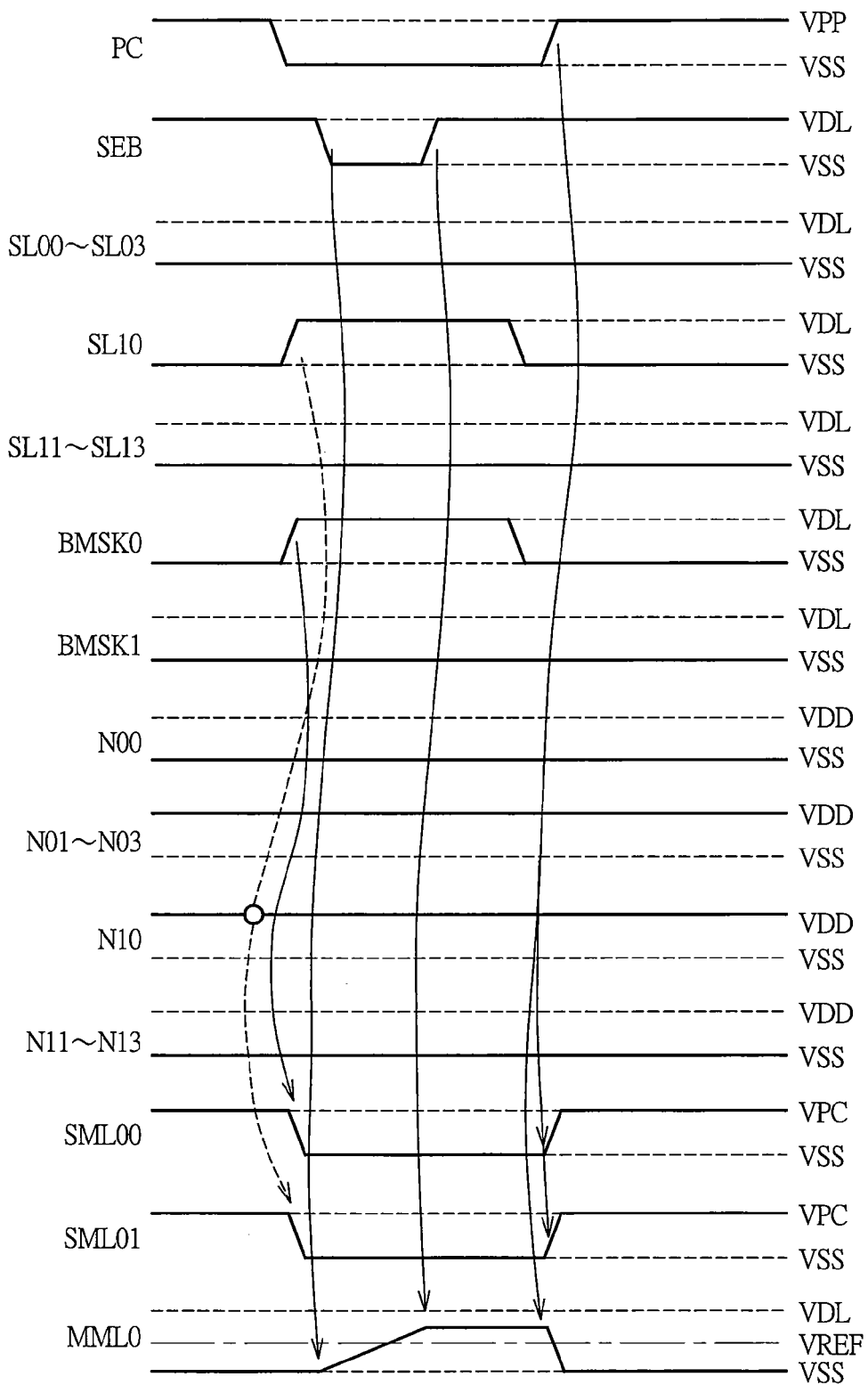
FIG. 14 is an explanatory view of an example of the operation timing on the matched information search in the memory array of FIG. 13 according to the embodiment 3.

Next, the search operation when the search key and the entry are matched with reference to FIG. 14. Where, it is assumed that the two memory blocks MB00 and MB01 are connected on the interest word line WL0, and a block mask signal BMSK0 and BMSK1 are connected to the sub-match detector connected to the corresponding sub-match line SML00 and SML01, respectively. Additionally, it is assumed that the entries corresponding to the range 1-3 (decimal number) are stored and compared with the search keys corresponding to 0-3 (decimal number) as well as FIG. 10. Accordingly, the storage node N00 in the memory block MB00 and the storage nodes N11-N13 in the memory block MB01 are kept at the ground voltage VSS, and the storage nodes N01-N03 in the memory block MB01 and the storage node N10 in the memory block MB01 are kept at the source voltage VDD.

Upon starting the search operation, the search lines SL10 with the ground voltage VSS are driven to the array voltage VDL while the search lines SL00-SL03 and SL11-SL13 are kept at the ground voltage VSS according to the encoded search key '0001 0000'. Since both of the transistors T612 and T613 are conductive state in the memory cell MC0 of the memory block MB01, the sub-match line SML01 with the precharge voltage VPC is discharged. Meanwhile, since the transistor to be conductive in the memory block MB00 is only the transistor T613 in the memory cell MC1-MC3, a current path between the sub-match line SML00 and ground electrode is not formed in any memory cell. However, the block mask signal BMSK0 with the ground voltage VSS is driven to the array voltage VDL so that the transistor T623 in the sub-match detector SMD00 is conductive thereby the sub-match line SML00 with the precharge voltage VPC is discharged. Therefore, the main-match line MML0 with the ground voltage VSS is charged by the main-match detector MMD0 so that it is determined that the result of comparison is matched.

According to the above described configuration and operation, the number of the search lines activated for the search key 'XX' can be decreased thereby the power consumption on the search operation can be reduced. So far the encoding in units of 2 bits has been described, however the number of unit bit is not limited to 2 bits. For example, if the encoding in units of 3 bits is performed as FIG. 26 according to the embodiment 2, the code '00000000' is defined corresponding to the information 'XXX' in the ternary notation so that the similar effect can be obtained. In the embodiment 2, eight search lines are activated, but in the present embodiment, only one block mask signal is activated thereby the power consumption on the search operation can be greatly reduced.

Modification of Embodiment 3

Figure 17:
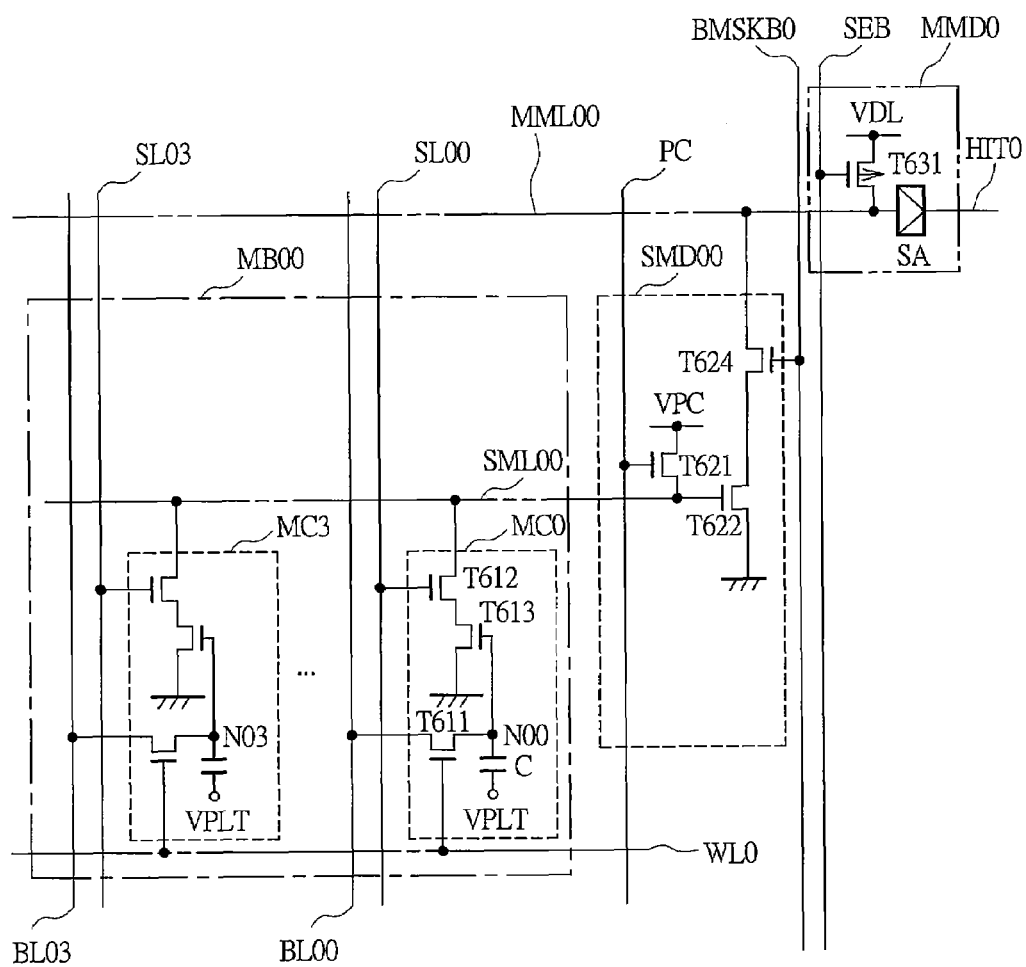
FIG. 17 is an explanatory view of further another constitutional example of the sub-match detector in the memory array of FIG. 1 according to the modification added to embodiment 3.

The configuration of the sub-match detector is not limited to the configuration of FIG. 13 and a configuration of FIG. 17 may be applied. The difference from FIG. 13 is that a NMOS transistor T624 in series with the NMOS transistor T622 is replaced with the NMOS transistor T623 in the sub-match detector SMD00. The block mask signal BMSKB0 is connected to the gate electrode, the main-match line MML0 is connected to the drain electrode and the drain electrode of the transistor T622 is connected to the source electrode, respectively of the transistor T624. Where, the connection order of the transistor T622 and T624 may be reversed. However, as described after, in order to reduce the load capacity of the main-match line to be charged on matching, preferably the transistor T624 is connected to the main-match line MLL0 so that the internal load of the sub-match detector can be separated. The correspondence between the search lines SL0$i$ ($i$=0, 1 - - - , 3) and the block mask signals BMSK0 is expressed in the case of 0-3 (decimal number) in FIG. 28. The difference from FIG. 27 is that the polarity of the block mask signal BMSB0 is reversed to the block mask signal BMSK0.

Figure 18:
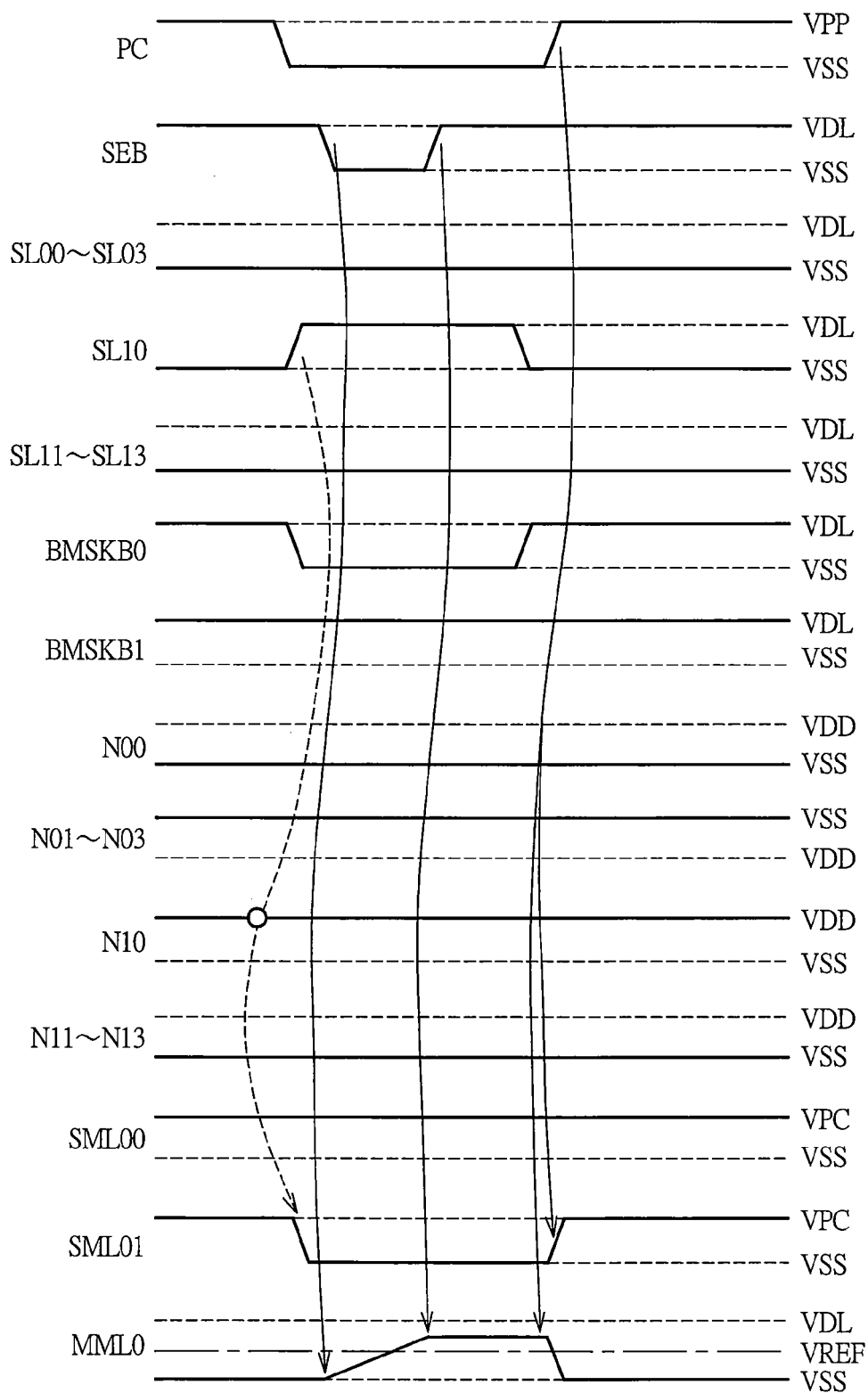
FIG. 18 is an explanatory view of an example of the operation timing on the matched information search in the memory array of FIG. 17 according to the modification added to embodiment 3.

Next, the search operation when the search key and the entry are matched with reference to FIG. 18. Where, it is assumed that the two memory blocks MB00 and MB01 are connected on the interest word line WL0, and a block mask signal BMSK0 and BMSKB1 are connected to the sub-match detector connected t to the corresponding sub-match line SML00 and SML01, respectively. Additionally, it is assumed that the entries corresponding to the range 1-3 (decimal number) are stored and compared with the search key corresponding to 0-3 (decimal number) as well as FIG. 14. Accordingly, the storage node N00 in the memory block MB00 and the storage nodes N11-N13 in the memory block MB01 are kept at the ground voltage VSS, and the storage nodes N01-N03 in the memory block MB01 and the storage node N10 in the memory block MB01 are kept at the source voltage VDD corresponding to the block-coded entry '0001 1110' according to the encoded entry '0001 1110' in FIG. 18.

Upon starting the search operation, the search lines SL10 with the ground voltage VSS is driven to the array voltage VDL while the search lines SL00-SL03 and SL11-SL13 are kept at the ground voltage VSS according to encoded search key '0001 0000'. Since both of the transistors T612 and T613 are conductive state in the memory cell MC0 of the memory block MB01, the sub-match line SML01 with the precharge voltage VPC is discharged. Meanwhile, since the transistor to be conductive state in the memory block MB00 is only the transistor T613 in the memory cell MC1-MC3, a current path between the sub-match line SML00 and ground electrode is not formed in any memory cell so that the sub-match line SML00 is kept at the precharge voltage VPC. However, the block mask signal BMSKB0 with the array voltage VDL is driven to the ground voltage VSS so that the transistor T624 in sub-match detector SMD00 is cut off thereby the main-match line MML00 with the ground voltage VSS is charged by the main-match detector MMD0. Therefore it is determined that the result of comparison is matched.

According to the above described configuration and operation, if the search key corresponding to the sub-match detector SMD00 is the information 'XX', the current path between the match line MML0 and the ground electrode can be shut off while the sub-match line SML00 is kept at the precharge voltage VPC. That is to say, the number of the search lines activated for the search key 'XX' can be decreased and also the sub-match lines can be stopped charging/discharging thereby the power consumption on the search operation further can be reduced.

Embodiment 4

Next, further another embodiment of the memory array configuration, especially the main-match detector of the TCAM to perform the search operation for the information using the One-hot-spot block code described in FIG. 1 is described. The object of the present embodiment that the power consumption of the main-match line corresponding to the memory cell which does not store the entry (where it is IP address) is reduced.

Figure 15:
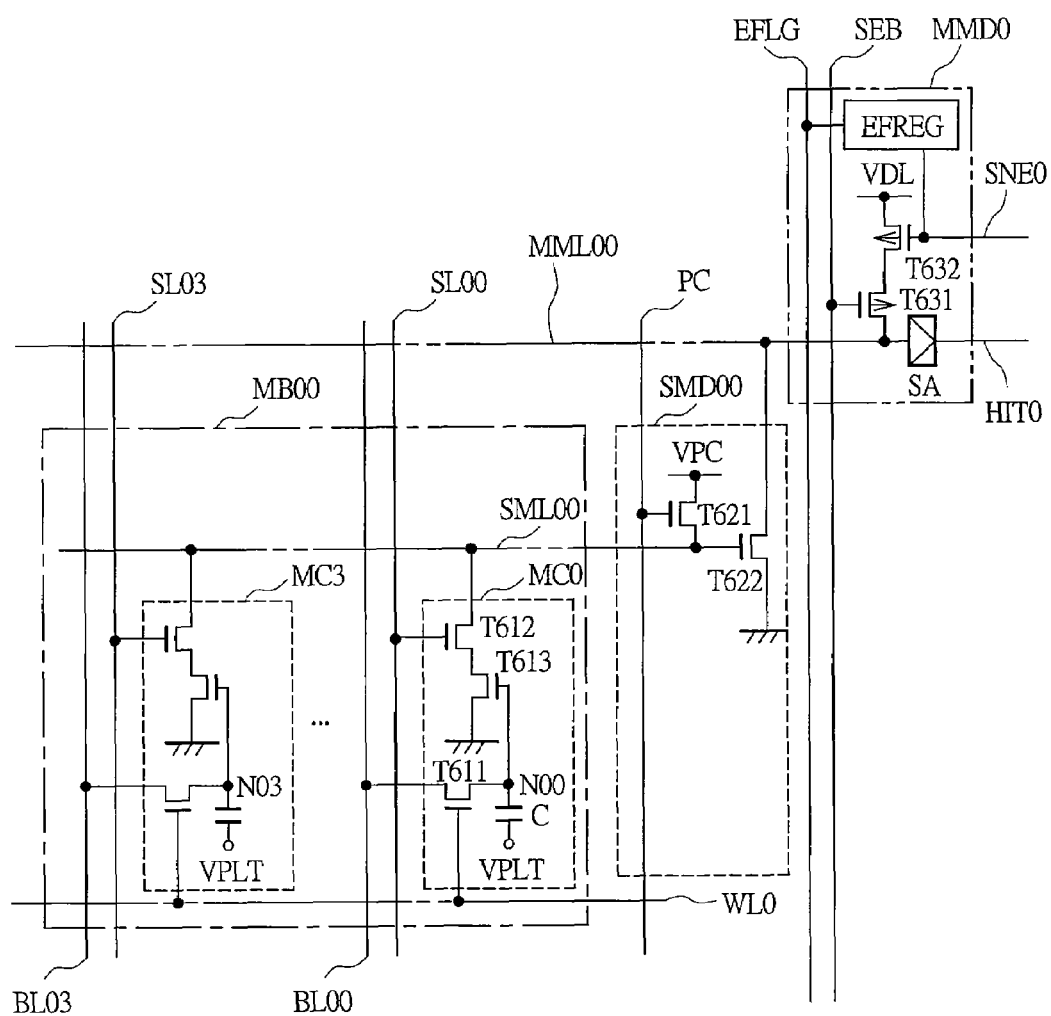
FIG. 15 is an explanatory view of another constitutional example of the main-match detector in the memory array of FIG. 1 according to the embodiment 4.

FIG. 15 is a part of the memory array according to the present embodiment, which is corresponding to FIG. 1 and FIG. 9. The difference between FIG. 15 and FIG. 9 is that a PMOS transistor T632 and an empty flag register EFREG are newly added to the main-match detector MMD0. The transistor T632 is inserted between the transistor T631 and the electrode supplied with the array voltage VDL to form a current path. The empty flag register EFREG is a circuit to hold the information whether the entry is stored in the memory cell on the corresponding word line or not. The information held in the empty flag register EFREG is written through an empty flag line EFLG arranged in parallel with the search enable signal line SEB. A storage node SNE0 of the empty flag register EFPEG is connected to the gate electrode of the transistor T632.

Next, the search operation of the main-match detector in such configuration is described. It is assumed that if the entry is stored in the memory cell on the corresponding word line WL0, the voltage of the storage node SNE0 is the low voltage level corresponding to the logical value '0'. Where, since the transistor T632 is conductive state, the main-match detector MMD0 drives the main-match line MML0 to determine the result of comparison. Alternatively, it is assumed that if the entry is not stored in the memory cell on the corresponding word line WL0, the voltage of the storage node SNE0 is the high voltage level corresponding to the logical value '1'. Where, since the transistor T632 is cut off, the main-match detector MMD0 does not determine the result of comparison thereby the main-match line MML0 is kept in non-activated state. The information stored in the empty flag register is EFREG written together with the entry.

According to the above described configuration and operation, the main-match detector according to the present embodiment can control the drive of the main-match line responsive to the usage condition of the memory array. That is to say, the charge/discharge power of the main-match line corresponding to the memory cell which does not store the entry on the search operation can be reduced. Therefore, since a number of memory cells which do not store the entry exist in the memory array in high-utilization ratio, the main-match detector of the present embodiment is most suitable for the memory array of FIG. 1. Additionally, if the main-match detector of the present embodiment is combined with the sub-match detector of FIG. 13, further power savable memory array can be achieved.

Embodiment 5

Figure 16:
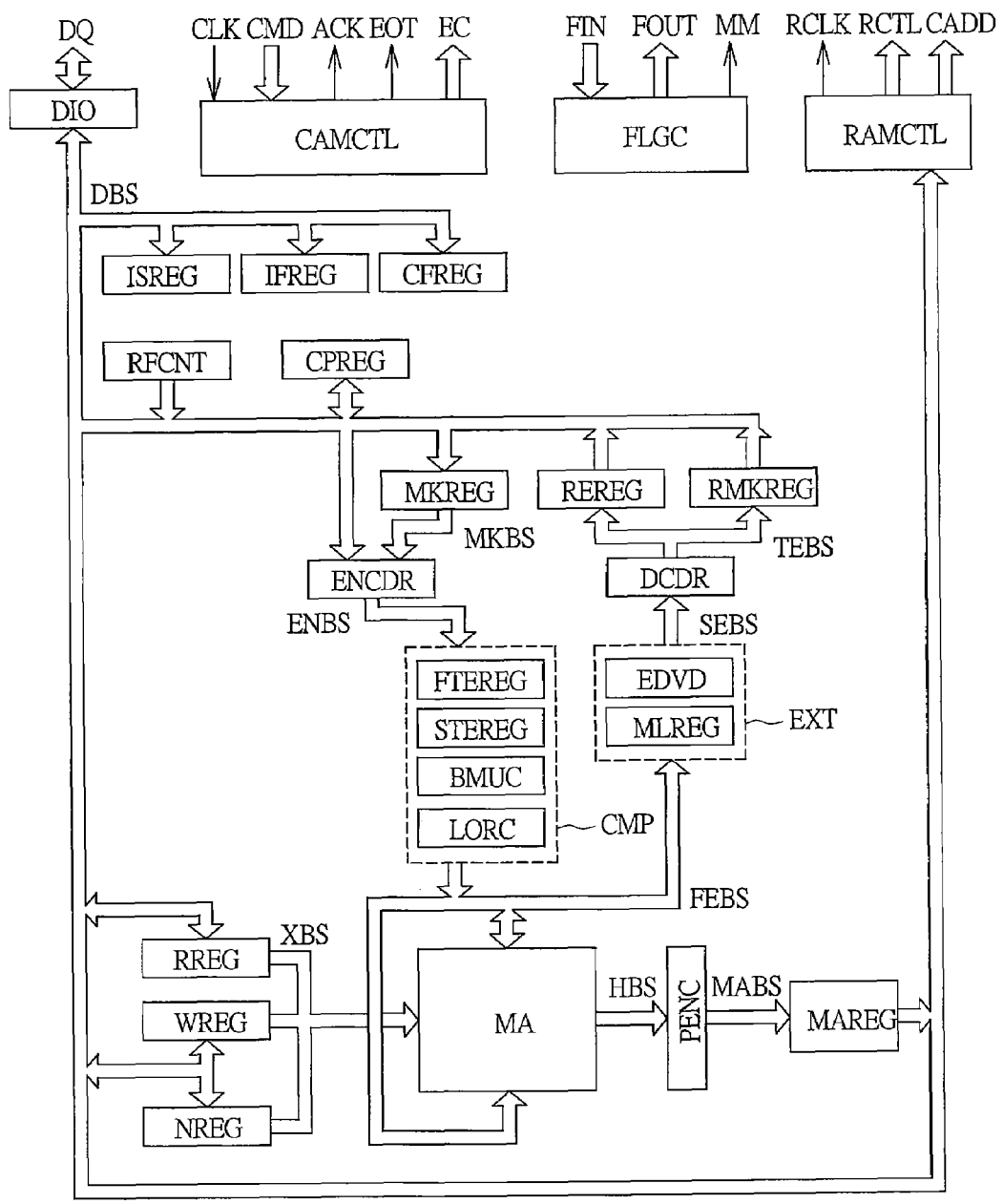
FIG. 16 is an explanatory view of another constitutional example of the substantial part block in the ternary content addressable memory using the memory array of FIG. 1 according to the embodiment 5.

FIG. 16 is an embodiment of another overall configuration of TCAM to perform the search operation using the One-hot-spot block coding information according to the embodiment 1 described in FIG. 8. The feature of the configuration is that both of the entry and the search key are inputted from the entry compressor CMP to the memory array MA through a first encoding entry bus FEBS together. According to such configuration, the range-specified search key is inputted into the memory array after being compressed as well as the entry.

Therefore, the number of search keys inputted into the memory array MA can be decreased so that the power consumption on the search operation of the TCAM can be reduced. Additionally, if the sub-match detector of FIG. 13 and the main-match detector of FIG. 15 are applied to the memory array MA, the power consumption of the TCAM further can be reduced as evidenced by the embodiment 3 and 4.

So far the TCAM to perform the search operation using the One-hot-spot block coding information is described. However, the configuration and operation according to the present invention are not limited to the described above, and various changes may be made therein. For example, the memory cell configuration is not limited to FIG. 9, and various configurations may be applied. Specifically, the order of the transistor T612 and T613 serially connected may be reversed as the memory cell of FIG. 5. In this case, since the connection node between the transistor T612 and T613 can be precharged by the T613 being conductive state in the standby state, the voltage drop caused by the charge share when the transistor T612 connected to the search line is conductive can be prevented so that the correct search operation can be achieved.

The search lines and the bit lines are independently provided in the memory cell of FIG. 9, however, these signal lines can be integrated. In this case, since the search line drive circuit block SDB as described in FIG. 1 can be eliminated, the chip area can be reduced. Additionally, the information is stored by the circuit configuration using one transistor and one capacitor in FIG. 9. However, such circuit configuration can be replaced with a so-called SRAM cell comprised of six transistors as FIG. 2 or an Electronically Erasable and Programmable Read Only Memory: EEPROM such as a flash memory to store information by storing charge in a floating gate. If it is replaced with the SRAM cell, the special processing step to form a capacitor is not required thereby the chip production cost can be reduced. Additionally since the transistor having an excellent switching characteristic as well as the logic circuits around the memory array can be used, the memory array to perform high-speed search operation can be achieved. Further since the refresh operation performed in FIG. 9 is not required, the TCAM can perform the search operation for longer time. Further the system design using the TCAM can be made easy. Alternatively, if it is replaced with the EEPROM, the refresh operation is not required as well as the SRAM. Since the memory cell area can be reduced, the large capacity and low-cost TCAM can be achieved. Further the memory cell can keep storing the entry shut off the power supply so that the low risk TCAM can be achieved. Finally, the method of writing the wide range of IP addresses by encoding and compressing the information in the ternary notation received in the chip using the entry encoder ENCDR and the entry compressor CMP is described in FIG. 8, however, other various methods can be applied. For example, the above described comparand register CPREDG is as the register common to both of the search key and the entry. The register has a counter built-in and has the function to receive and hold only the upper limit and lower limit of the search key and the entry and generate a search key and an entry corresponding to the specified range in the chip. According to such configuration and function, the number of times of transmitting/receiving the range-specified IP address can be reduced thereby the power consumption of the data input/output circuit is reduced so that the low power TCAM can be achieved.

Additionally, if the clock frequency in the chip is higher than the data bus DQ, the number of cycles required for writing/reading can be decreased so that further high-speed operation becomes possible.

Further, it is also possible that the One-hot-spot block coded entry is received by the external control chips such as the network processor NP and the search engine SE described in FIG. 2, and directly written it into the memory array. In this case, not only the entry encoder ENCDR and the entry compressor CMP but also the entry extractor EXT to expand and decode entries, and the entry decoder can be eliminated so that the chip area can be reduced. Additionally, the entry and the search key can be efficiently received so that the number of cycles required for writing/reading and the power consumption can be also reduced. Further, not only the number of entries but also the number of cycles required when the wide range of IP address is inputted as the search key can be decreased so that the high-speed and low-power search operation can be achieved.

In the foregoing specification, the invention has been described with reference to specific embodiments thereof. It is to be understood that the present invention is not intended to be limited to the above described embodiments, and various changes may be made therein without departing from the spirit of the present invention. For example, the TCAM according to the present invention can be applied to not only the off-chip i.e. single device but also the TCAM block installed into the system LSI so-called system on chip(SoC), and the effect similar to the above mentioned embodiment can be obtained.

As thus described above, the semiconductor device according to the present invention can increase the amount of information per entry regarding not only IP address but also various information, and is suitable for performing the search operation using a table with a large amount of information.

Embodiment 6

Figure 29:
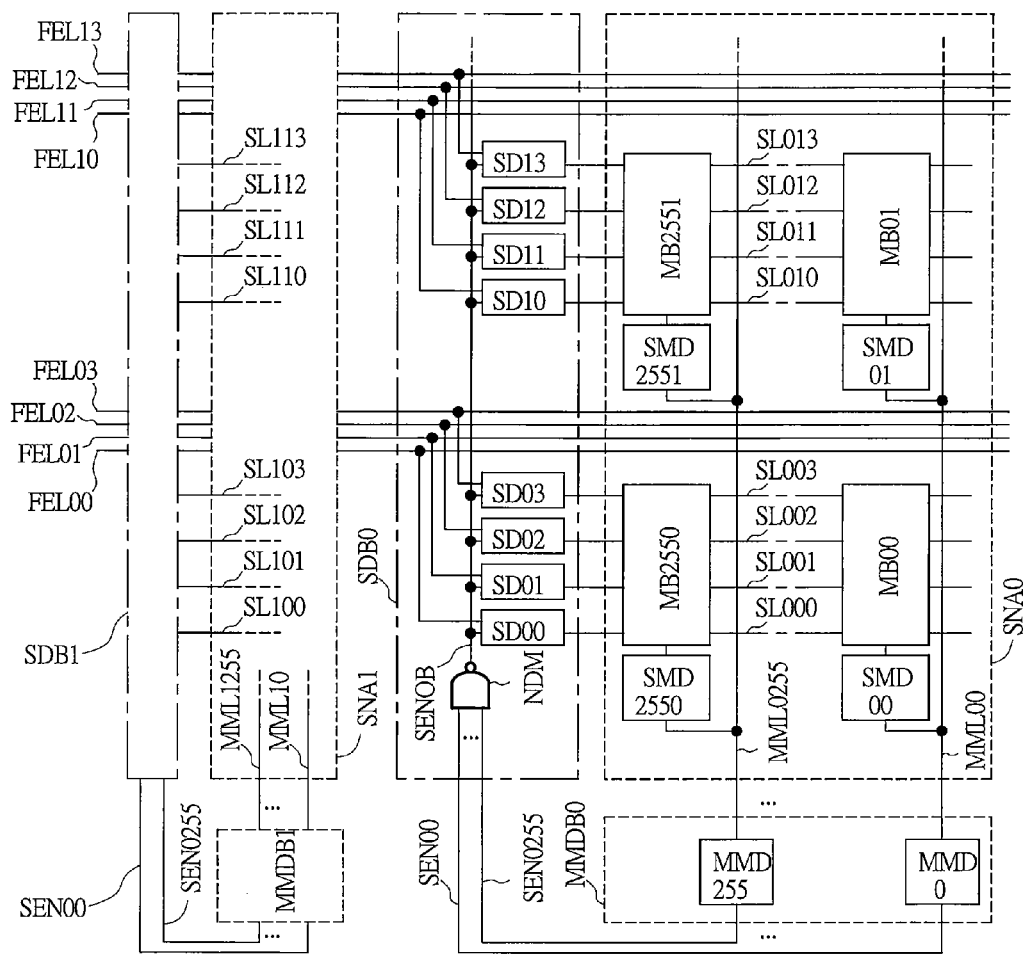
FIG. 29 is an explanatory view of a constitutional example of the memory array used for the ternary content addressable memory of FIG. 8 according to the embodiment 6.

FIG. 29 is an embodiment of the configuration of the memory array MA described in FIG. 8 and FIG. 16. The configuration has two features as follows: The first feature is that it has two sub-arrays SMA0 and SMA1 consisting of the memory arrays described in FIG. 1; The second feature is that each of search line drive circuit block SDB0 and SDB1 to receive the first encoding entry line (FEL00-FEL03, FEL10-FEL13, - - - ) constituting a first encoding entry bus FEBS and drive the search lines (SL000-SL003, SL010-SL013, - - - , SL100-SL103, SL110-SL113 - - - ) is controlled using the corresponding main-match detector block MMDB0 and MMDB1. Incidentally, the row decoder, the read/write circuit block, bit lines and word lines arranged in the sub-array SMA0 and SMA1 are omitted for ease of explanation in FIG. 29. Hereinafter, these features are described in detail with reference to the SMA0.

The sub-array SMA0 has 256 of main-match line MML00-MML0255. The memory block MB00, MB01, - - - , MB2550, MB2551, - - - are arranged at the intersecting points of the main-match lines and the search line SL000-SL003, SL010-SL013, - - - . The sub-match line detectors SMD00, SMD01, - - - , SMD2550, SMD2551, - - - are arranged corresponding to the memory blocks, respectively.

Figure 30:
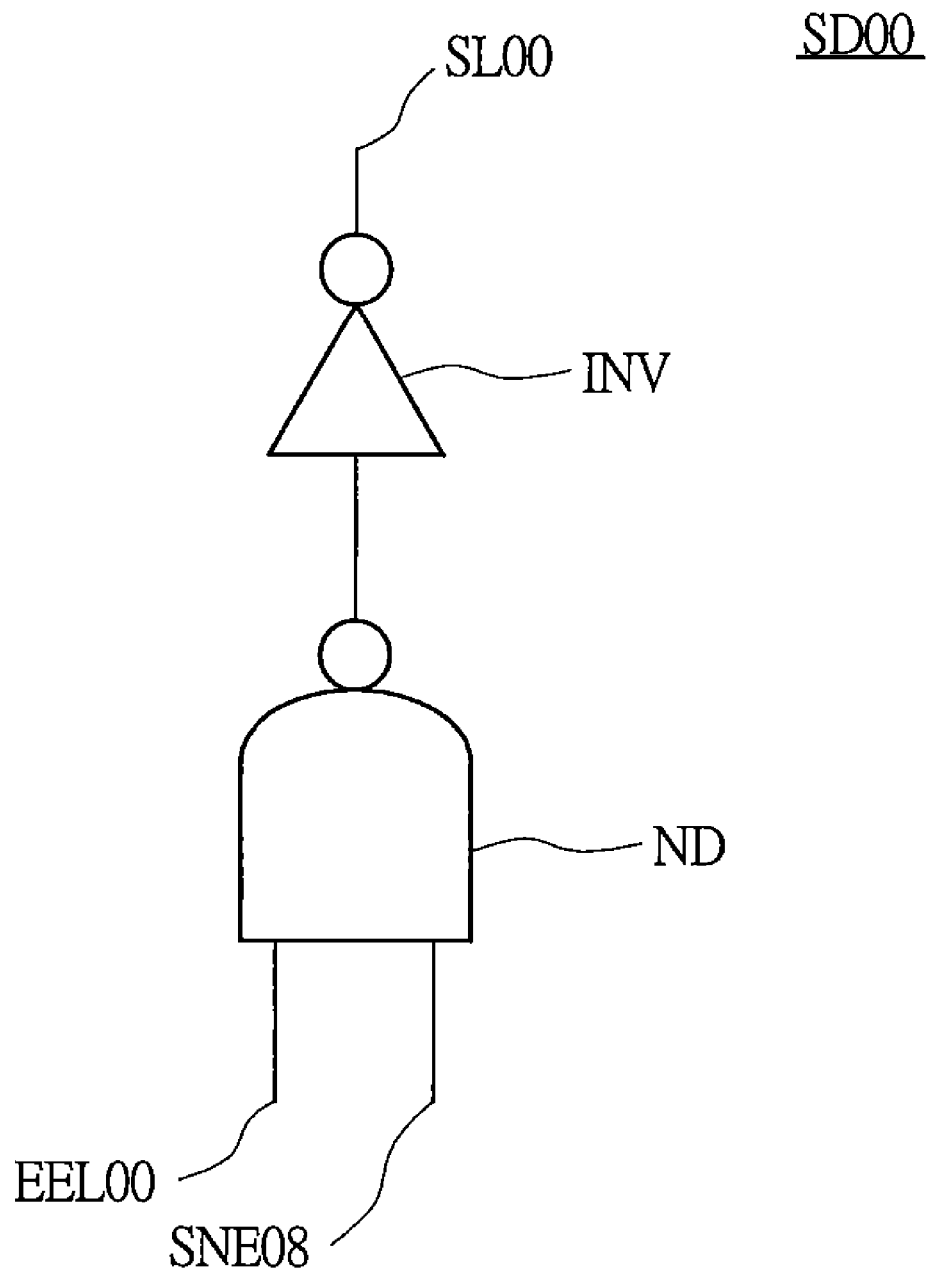
FIG. 30 is an explanatory view of a constitutional example of the search line drive circuit according to the embodiment 6.

A search line drive circuit block SDB0 is comprised of search line drive circuit SD00-SD03, SD10-SD13, - - - arranged between the first encoding entry line FEL00-FEL03, FEL10-FEL13, - - - and the search line SL000-SL003, SL010-SL013, and a 256 input NAND circuit NDM. Each of the search line drive circuit is comprised of an inverter circuit INV and the NAND circuit ND, respectively as FIG. 30. For example, in the search line drive circuit SD00, the first encoding entry line FEL00 is connected to one input terminal of the NAND circuit ND, and an output signal SNE0B of the NAND circuit NDM is connected to the other input terminal of the NAND circuit ND, respectively. An output terminal of the NAND circuit ND is an input terminal of the inverter circuit INV and an output terminal of the inverter circuits is connected to the search line SL00.

A main-match detector block MMDB0 is comprised of 256 of main-match detector MMD0-MMD255. Signal SNE00-SNE0255 (for example, the storage node SNE0 in the main-match detector MMD0 of FIG. 15 corresponds to the signal SNE00) connected to the storage node of the empty flag register EFREG in each main-match detector are connected to each input terminal of the 256 input NAND circuit NDM in the above described search line drive circuit block SDB0.

According to such configuration, the following two effects are obtained: The first effect is that since the memory array is divided, the search line length is shortened so that the load capacity can be reduced thereby the time for driving the search line can be shortened. That is to say, the time for the search operation can be shortened; the second effect is that if any entry is not written into the memory cell in the sub-array, the corresponding search lines can be stopped driving. That is to say, since if the entry is empty, the storage node of the corresponding empty entry register is the high voltage level corresponding the logical value '1' as described in FIG. 15, if the sub-array SMA0 is empty, the signal SNE0B is kept at the ground voltage VSS so that the corresponding search line is kept at the ground voltage VSS. Therefore, the driving of the search line can be decreased on the search operation thereby the power consumption can be reduced.

The above described the second effect is especially enhanced for the CAM to store the entry using the One-hot-spot block code according to the present invention. The reason is that the present CAM can store the range-specified IP addresses with the less number of entries than before as FIG. 24. Therefore the area of the memory array to compare the information can be decreased. Accordingly it is not required to perform the search operation in all of the memory arrays so that the search operation in the needless sub-array can be stopped thereby the power consumption can be reduced over the chips. So far the memory array configuration according to the present embodiment taking FIG. 29 as an example, however, other various configurations may be applied. For example, the search line drive circuit block is arranged for each sub-array having 256 of main-match lines, however the arrangement is not limited to that. Since the CAM according to the present invention reads the entry by charge sharing as well as the conventional DRAM, the bit line capacity i.e. bit line length is limited in order to obtain sufficient read signals. If the length is assumed a length for 256 of match lines as FIG. 29, the search line length is not limited to such length and can be lengthened as far as the time for driving the search lines is allowed in the search operation. In this case, since the number of the search line drive circuit blocks in the memory array so that the area of the memory array can be reduced.

Alternatively, it is possible that the search line length is shorter than the bit line length and a plurality of search line drive circuit blocks every sub-arrays are arranged. In this case, since the activated search lines are minutely controlled so that the power consumption can be further reduced depending on the number of entries.

The constitutional example that the 256 input NAND circuit is employed in the search line drive circuit block is shown in FIG. 29, however, the configuration may be changed without departing from the logic. For example, the combination of a 2-3 input NAND circuits or a NOR circuit and the inverter circuit achieves the efficient layout of the search line drive circuit block. Alternatively, if the entry is sequentially written from the memory cell corresponding to the main-match detector MMD0, since whether the entry is empty or not is determined only by the signal corresponding to the storage node of the main-match detector MMD0, the signal is received by the inverter circuit replaced with the 256 input NAND circuit NDM and each search line drive circuit may be controlled by the output signal. In this case, since the area of the logic circuit and the number of the signal lines can be decreased so that the area of the memory array can be reduced.

What is claimed is:

1. A semiconductor device comprising an input/output circuit arranged to connect a first group of signal lines and a second group of signal lines, a first register, an encoder, an entry compressor and a memory array, wherein
    the input/output circuit outputs a first information or a second information to the second group of signal lines,
    the first register holds the first information,
    the encoder outputs a third information encoded based on the first and second information received through the second group of signal lines to a third group of signal lines,
    the entry compressor receives a plurality of the third information sequentially inputted through the third group of signal lines and performs logical operation to generate a fourth information and outputs the fourth information to a fourth group of signal lines, and
    the memory array stores the fourth information inputted through the fourth group of signal lines and compares the fourth information with the third information through the third group of signal lines.

2. The semiconductor device according to claim 1, wherein the encoder encodes in units of the plurality of bits.

3. The semiconductor device according to claim 2, wherein the entry compressor includes a first plurality of registers, a comparator and an OR circuit, wherein
    the first plurality of registers store a plurality of the third information,
    the comparator compares the information stored in each of the plurality of first registers per bit, and
    the OR circuit performs logical sum of the information stored in each of the plurality of registers per bit according to the result of comparison by the comparator to generate the fourth information.

4. The semiconductor device according to claim 3, wherein the semiconductor device further comprises a second register and a third register, a decoder, and an entry extractor, wherein
    the entry extractor divides the fourth information read from the memory array through the fourth group of signal lines to generate a fifth plurality of information and stores the plurality of information,
    the decoder stores the plurality of first and second information obtained by decoding each of the fifth plurality of information received through a fifth group of signal lines,
    the second register stores a plurality of the first information received through the fifth group of signal lines,
    the third register stores a plurality of the second information received through the fifth group of signal lines, and
    a plurality of the first information stored in the second register and a plurality of the second information stored in the third register are outputted from the second group of signal lines to the first group of signal lines through the input/output circuit.

5. The semiconductor device according to claim 4, wherein the semiconductor device further comprises a counter and a memory array comprised of dynamic memory cells, wherein
    the counter generates a row address to select the plurality of memory cells in refresh operations.

* * * * *